(12) United States Patent
Ohue et al.

(10) Patent No.: US 11,927,857 B2
(45) Date of Patent: Mar. 12, 2024

(54) DISPLAY DEVICE

(71) Applicant: Japan Display Inc., Tokyo (JP)

(72) Inventors: Yoshihide Ohue, Tokyo (JP); Yuuji Oomori, Tokyo (JP); Koji Kitamura, Tokyo (JP); Kentaro Okuyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/296,228

(22) Filed: Apr. 5, 2023

(65) Prior Publication Data

US 2023/0324750 A1 Oct. 12, 2023

(30) Foreign Application Priority Data

Apr. 8, 2022 (JP) .................................. 2022-064759

(51) Int. Cl.
| | | |
|---|---|---|
| *G02F 1/1362* | (2006.01) | |
| *G02F 1/1333* | (2006.01) | |
| *G02F 1/1334* | (2006.01) | |
| *G02F 1/13357* | (2006.01) | |
| *G02F 1/1343* | (2006.01) | |

(Continued)

(52) U.S. Cl.
CPC .. *G02F 1/136286* (2013.01); *G02F 1/133342* (2021.01); *G02F 1/1334* (2013.01); *G02F 1/133615* (2013.01); *G02F 1/13439* (2013.01); *G02F 1/136209* (2013.01); *G02F 1/1368* (2013.01); *H01L 27/124* (2013.01)

(58) Field of Classification Search
CPC ......... G02F 1/136286; G02F 1/133342; G02F 1/1334; G02F 1/133615; G02F 1/13439; G02F 1/136209; G02F 1/1368; H01L 27/124

See application file for complete search history.

(56) References Cited

U.S. PATENT DOCUMENTS

| | | |
|---|---|---|
| 11,579,482 B2 | 2/2023 | Ohue |
| 2009/0155933 A1 | 6/2009 | Ohara et al. |

FOREIGN PATENT DOCUMENTS

| | | |
|---|---|---|
| JP | 2009145681 A | 7/2009 |
| JP | 2020160254 A | 10/2020 |

OTHER PUBLICATIONS

JP 2020091400 A translation (Year: 2020).*

* cited by examiner

*Primary Examiner* — James A Dudek

(74) *Attorney, Agent, or Firm* — K&L Gates LLP

(57) ABSTRACT

A display device includes: an array substrate; a counter substrate; a liquid crystal layer between the array substrate and the counter substrate; and a light source disposed so as to emit light into a side surface of the array substrate or a side surface of the counter substrate. The array substrate includes: signal lines arranged in a first direction with spaces interposed between the signal lines; scan lines arranged in a second direction with spaces interposed therebetween; a switching element coupled to a corresponding one of the scan lines and a corresponding one of the signal lines; an organic insulating layer that covers at least the switching element; and a metal layer provided on the upper side of the organic insulating layer so as to overlap the organic insulating layer. A positional misalignment portion of each signal line does not overlap a positional misalignment portion of the metal layer.

17 Claims, 22 Drawing Sheets

(51) Int. Cl.
*G02F 1/1368* (2006.01)
*H01L 27/12* (2006.01)

DISPLAY DEVICE

CROSS-REFERENCE TO RELATED APPLICATION

This application claims the benefit of priority from Japanese Patent Application No. 2022-064759 filed on Apr. 8, 2022, the entire contents of which are incorporated herein by reference.

BACKGROUND

1. Technical Field

What is disclosed herein relates to a display device.

2. Description of the Related Art

Japanese Patent Application Laid-open Publication No. 2020-160254 (JP-A-2020-160254) describes a display device including a first light-transmitting substrate, a second light-transmitting substrate disposed so as to face the first light-transmitting substrate, a liquid crystal layer including polymer-dispersed liquid crystals filled between the first light-transmitting substrate and the second light-transmitting substrate, and at least one light emitter disposed so as to face at least one of side surfaces of the first light-transmitting substrate and the second light-transmitting substrate.

Japanese Patent Application Laid-open Publication No. 2009-145681 (JP-A-2009-145681) describes a method for manufacturing a thin-film transistor (TFT) substrate (liquid crystal display device) in which, when one exposure area is divided into a first exposure area and a second exposure area, and each of the exposure areas is individually exposed, occurrence of unevenness in display quality, such as occurrence of misalignment of resist patterns formed at a boundary portion (positional misalignment between metal layers) or occurrence of large variations in dimensions of the resist patterns can be reduced.

In the method for manufacturing a display device described in JP-A-2009-145681, the boundary portion is divided into a plurality of small areas such that a plurality of first small areas that are a part of the first exposure area and a plurality of second small areas that are a part of the second exposure area are arranged in a checkerboard pattern or a mosaic pattern, and the small areas are exposed.

If the method for manufacturing a display device described in JP-A-2009-145681 is applied in the manufacturing of a display device of JP-A-2020-160254, reflection of light in the metal layer formed at the boundary portion may partially increase the degree of noise recognition and display quality may be deteriorated, depending on the direction of incidence of external light.

For the foregoing reasons, there is a need for a display device that improves the display quality.

SUMMARY

According to an aspect, a display device includes: an array substrate; a counter substrate; a liquid crystal layer between the array substrate and the counter substrate; and a light source disposed so as to emit light into a side surface of the array substrate or a side surface of the counter substrate. The array substrate includes: signal lines arranged in a first direction with spaces interposed between the signal lines; scan lines arranged in a second direction with spaces interposed between the scan lines; a switching element coupled to a corresponding one of the scan lines and a corresponding one of the signal lines; an organic insulating layer that covers at least the switching element; and a metal layer provided on the upper side of the organic insulating layer so as to overlap the organic insulating layer. A positional misalignment portion of each of the signal lines does not overlap a positional misalignment portion of the metal layer.

According to an aspect, a display device includes: an array substrate; a counter substrate; a liquid crystal layer between the array substrate and the counter substrate; and a light source disposed so as to emit light into a side surface of the array substrate or a side surface of the counter substrate. The array substrate includes: signal lines arranged in a first direction with spaces interposed between the signal lines; scan lines arranged in a second direction with spaces interposed between the scan lines; a switching element coupled to a corresponding one of the scan lines and a corresponding one of the signal lines; an organic insulating layer that covers at least the switching element; and a metal layer provided on the upper side of the organic insulating layer so as to overlap the organic insulating layer. A positional misalignment portion of each of the scan lines does not overlap a positional misalignment portion of the metal layer.

According to an aspect, a display device includes: an array substrate; a counter substrate; a liquid crystal layer between the array substrate and the counter substrate; and a light source disposed so as to emit light into a side surface of the array substrate or a side surface of the counter substrate. The array substrate includes: signal lines arranged in a first direction with spaces interposed between the signal lines; scan lines arranged in a second direction with spaces interposed between the scan lines; a light-blocking layer that is provided in the same layer as that of each of the scan lines, extends along each of the signal lines, and is provided in a position overlapping part of the signal lines; a switching element coupled to a corresponding one of the scan lines and a corresponding one of the signal lines; an organic insulating layer that covers at least the switching element; and a metal layer provided on the upper side of the organic insulating layer so as to overlap the organic insulating layer. A positional misalignment portion of the light-blocking layer does not overlap a positional misalignment portion of each of the signal lines.

DETAILED DESCRIPTION

Figure 1:
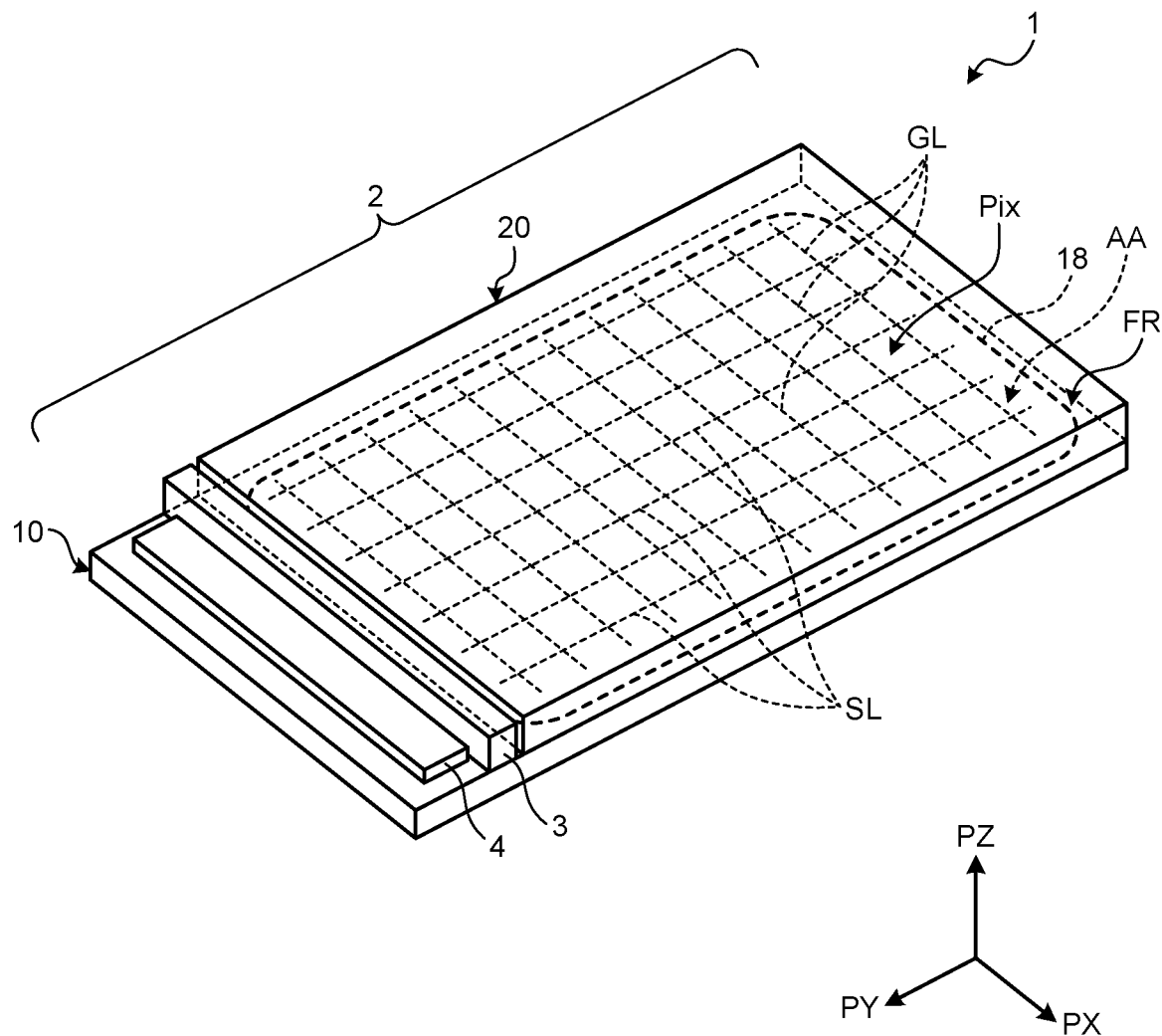
FIG. 1 is a perspective view illustrating an example of a display device according to the present embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

In this disclosure, when an element is described as being "on" another element, the element can be directly on the other element, or there can be one or more elements between the element and the other element.

Figure 2:
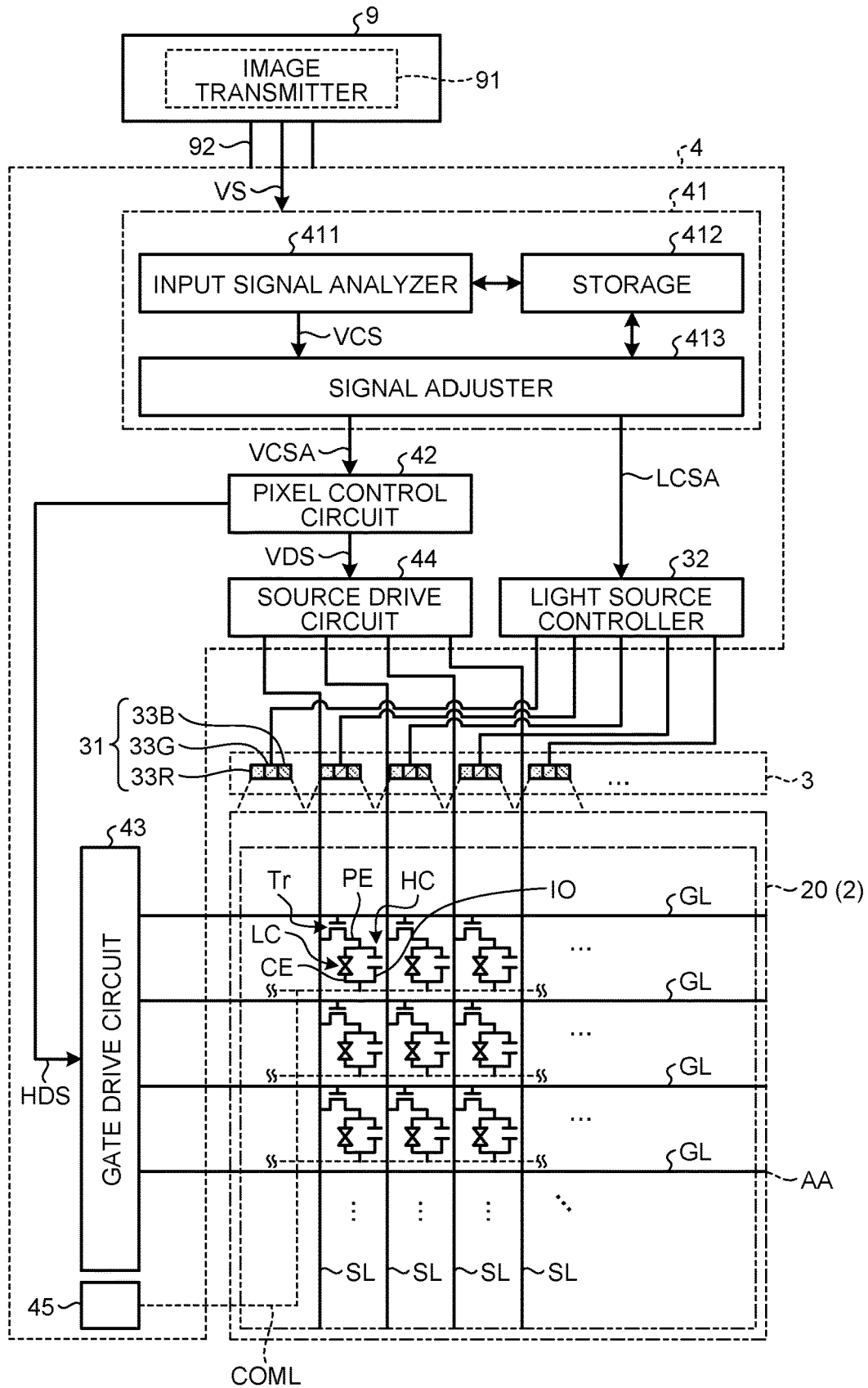
FIG. 2 is a block diagram illustrating the display device of the present embodiment.
Figure 3:
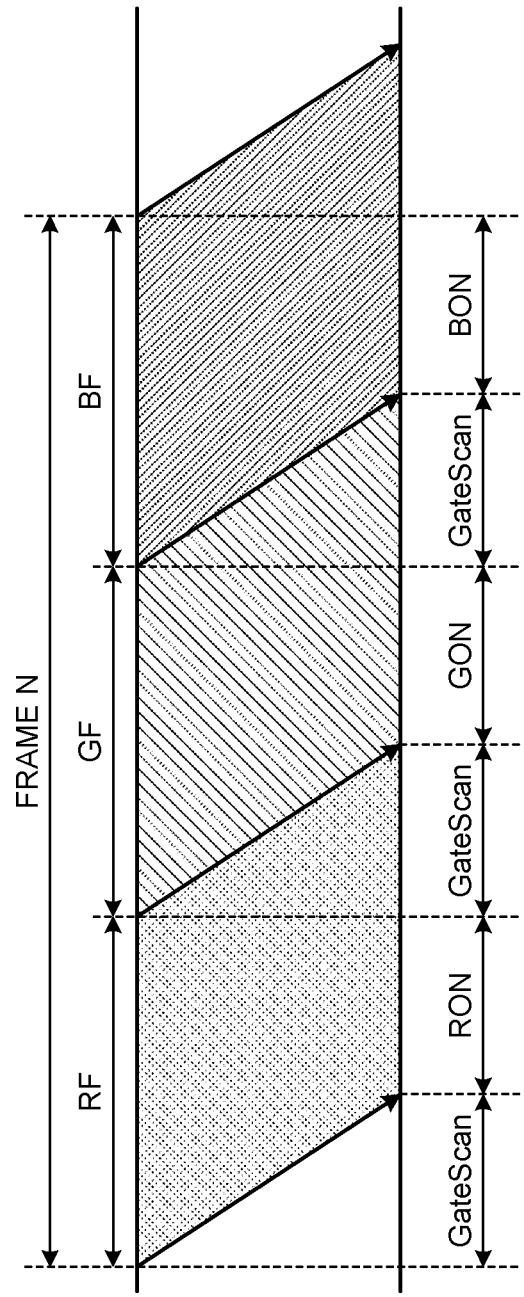
FIG. 3 is a timing diagram explaining timing of light emission by a light source in a field-sequential system of the present embodiment.

FIG. 1 is a perspective view illustrating an example of a display device according to the present embodiment. FIG. 2 is a block diagram illustrating the display device of the present embodiment. FIG. 3 is a timing diagram explaining timing of light emission by a light source in a field-sequential system of the present embodiment.

As illustrated in FIG. 1, a display device 1 includes a display panel 2, a light source 3, and a drive circuit 4. A first direction PX denotes one direction in the plane of the display panel 2. A second direction PY denotes a direction orthogonal to the first direction PX. A third direction PZ denotes a direction orthogonal to the PX-PY plane.

Figure 5:
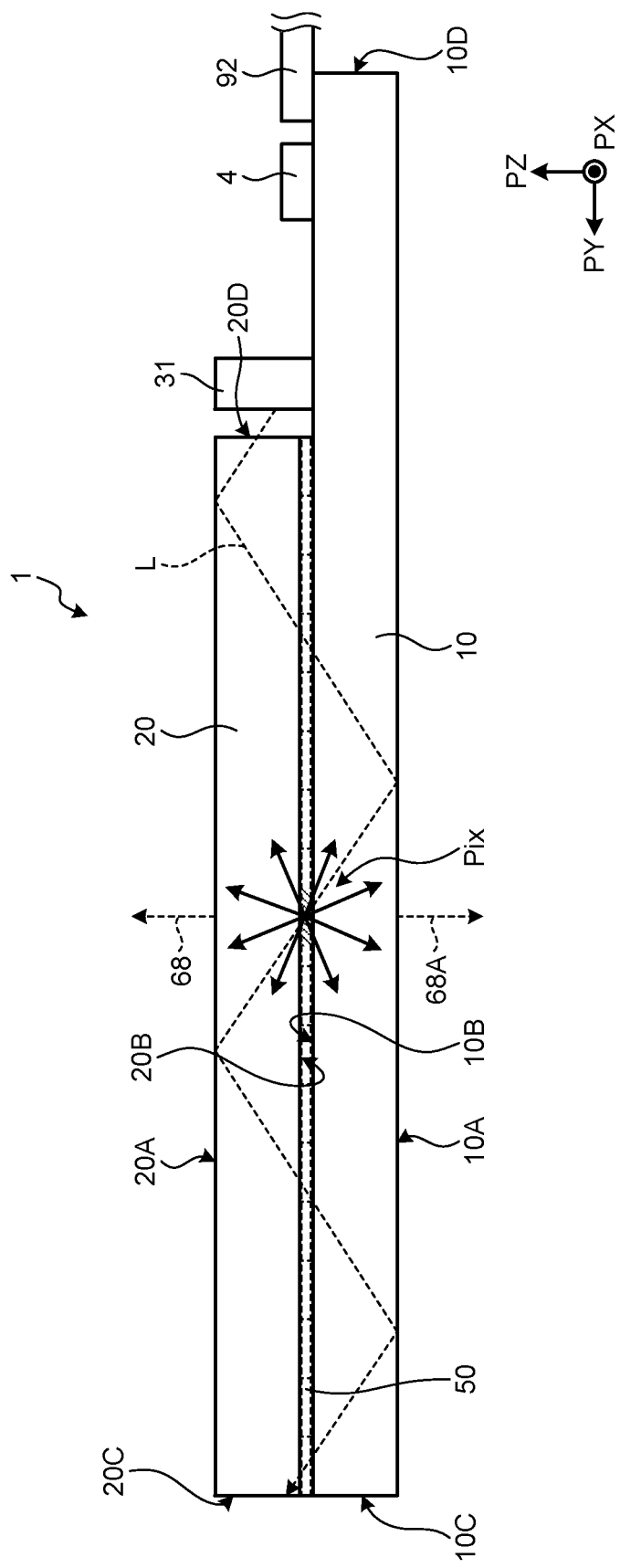
FIG. 5 is a sectional view illustrating an example of a section of the display device of FIG. 1.

The display panel 2 includes an array substrate 10, a counter substrate 20, and a liquid crystal layer 50 (refer to FIG. 5). The counter substrate 20 faces a surface of the array substrate 10 in a direction orthogonal thereto (in the direction PZ illustrated in FIG. 1). In the liquid crystal layer 50 (refer to FIG. 5), polymer-dispersed liquid crystals LC (to be described later) are sealed by the array substrate 10, the counter substrate 20, and a sealing portion 18.

As illustrated in FIG. 1, the display panel 2 has a display area AA capable of displaying images and a peripheral area FR outside the display area AA. A plurality of pixels Pix are arranged in a matrix having a row-column configuration in the display area AA. In the present disclosure, a row refers to a pixel row including m pixels Pix arranged in one direction. In addition, a column refers to a pixel column including n pixels Pix arranged in a direction orthogonal to the direction in which the rows extend. The values of m and n are defined depending on a display resolution in the vertical direction and a display resolution in the horizontal direction. A plurality of scan lines GL are provided corresponding to the rows, and a plurality of signal lines SL are provided corresponding to the columns.

The light source 3 includes a plurality of light emitters 31. As illustrated in FIG. 2, a light source controller (light source control circuit) 32 is included in the drive circuit 4. The light source controller 32 may be a circuit separate from the drive circuit 4. The light emitters 31 are electrically coupled to the light source controller 32 through wiring in the array substrate 10.

As illustrated in FIG. 1, the drive circuit 4 is fixed to the surface of the array substrate 10. As illustrated in FIG. 2, the drive circuit 4 includes a signal processing circuit 41, a pixel control circuit 42, a gate drive circuit 43, a source drive circuit 44, and a common potential drive circuit 45. The array substrate 10 has an area in a PX-PY plane larger than that of the counter substrate 20, and the drive circuit 4 is provided on a projecting portion of the array substrate 10 exposed from the counter substrate 20.

The signal processing circuit 41 receives a first input signal (such as a red-green-blue (RGB) signal) VS from an image transmitter 91 of an external host controller 9 through a flexible substrate 92.

The signal processing circuit 41 includes an input signal analyzer 411, a storage 412, and a signal adjuster 413. The input signal analyzer 411 generates a second input signal VCS based on an externally received first input signal VS.

The second input signal VCS is a signal for determining a gradation value to be given to each of the pixels Pix of the display panel 2 based on the first input signal VS. In other words, the second input signal VCS is a signal including gradation information on the gradation value of each of the pixels Pix.

The signal adjuster 413 generates a third input signal VCSA from the second input signal VCS. The signal adjuster 413 transmits the third input signal VCSA to the pixel control circuit 42, and transmits a light source control signal LCSA to the light source controller 32. The light source control signal LCSA is a signal including information on light quantities of the light emitters 31 set in accordance with, for example, input gradation values given to the pixels Pix. For example, the light quantities of the light emitters 31 are set smaller when a darker image is displayed. When a brighter image is displayed, the light quantities of the light emitters 31 are set larger.

The pixel control circuit 42 generates a horizontal drive signal HDS and a vertical drive signal VDS based on the third input signal VCSA. In the present embodiment, since the display device 1 is driven based on the field-sequential system, the horizontal drive signal HDS and the vertical drive signal VDS are generated for each color emittable by the light emitter 31.

The gate drive circuit 43 sequentially selects the scan lines GL of the display panel 2 based on the horizontal drive signal HDS during one vertical scan period. The scan lines GL can be selected in any order.

The source drive circuit 44 supplies a gradation signal corresponding to the output gradation value of each of the pixels Pix to a corresponding one of the signal lines SL of the display panel 2 based on the vertical drive signal VDS during one horizontal scan period.

In the present embodiment, the display panel 2 is an active-matrix panel. For that reason, the display panel 2 includes the signal (source) lines SL extending in the second direction PY and the scan (gate) lines GL extending in the first direction PX in plan view, and includes switching elements Tr at intersecting portions between the signal lines SL and the scan lines GL.

A thin-film transistor is used as each of the switching elements Tr. A bottom-gate transistor or a top-gate transistor may be used as an example of the thin-film transistor. Although a single-gate thin film transistor is exemplified as the switching element Tr, the switching element Tr may be a double-gate transistor. One of the source electrode and the drain electrode of the switching element Tr is coupled to a corresponding one of the signal lines SL. The gate electrode of the switching element Tr is coupled to a corresponding one of the scan lines GL. The other of the source electrode and the drain electrode is coupled to one end of a capacitor of the polymer-dispersed liquid crystals LC to be described later. The capacitor of the polymer-dispersed liquid crystals LC is coupled at one end thereof to the switching element Tr through a pixel electrode PE, and coupled at the other end thereof to common potential wiring COML through a common electrode CE. Holding capacitance HC is generated between the pixel electrode PE and a holding capacitance electrode IO electrically coupled to the common potential wiring COML. A potential of the common potential wiring COML is supplied by the common potential drive circuit 45.

Each of the light emitters 31 includes a light emitter 33R of a first color (such as red), a light emitter 33G of a second color (such as green), and a light emitter 33B of a third color (such as blue). The light source controller 32 controls the light emitter 33R of the first color, the light emitter 33G of the second color, and the light emitter 33B of the third color so as to emit light in a time-division manner based on the light source control signal LCSA. In this manner, the light emitter 33R of the first color, the light emitter 33G of the second color, and the light emitter 33B of the third color are driven based on the field-sequential system.

As illustrated in FIG. 3, in a first sub-frame (first predetermined time) RF, the light emitter 33R of the first color emits light during a first color light emission period RON, and the pixels Pix selected during one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the first color is lit up during the first color light emission period RON.

Then, in a second sub-frame (second predetermined time) GF, the light emitter 33G of the second color emits light during a second color light emission period GON, and the pixels Pix selected during the one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the second color is lit up during the second color light emission period GON.

Further, in a third sub-frame (third predetermined time) BF, the light emitter 33B of the third color emits light during a third color light emission period BON, and the pixels Pix selected during the one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the third color is lit up during the third color light emission period BON.

Since a human eye has limited temporal resolving power and produces an afterimage, an image with a combination of three colors is recognized in a period of one frame (1F). The field-sequential system can eliminate the need for a color filter, and thus can reduce an absorption loss by the color filter. As a result, higher transmittance can be obtained. In the color filter system, one pixel is made up of sub-pixels obtained by dividing each of the pixels Pix into the sub-pixels of the first color, the second color, and the third color. In contrast, in the field-sequential system, the pixel need not be divided into the sub-pixels in such a manner. A fourth sub-frame may be further included to emit light in a fourth color different from any one of the first color, the second color, and the third color.

Figure 4:
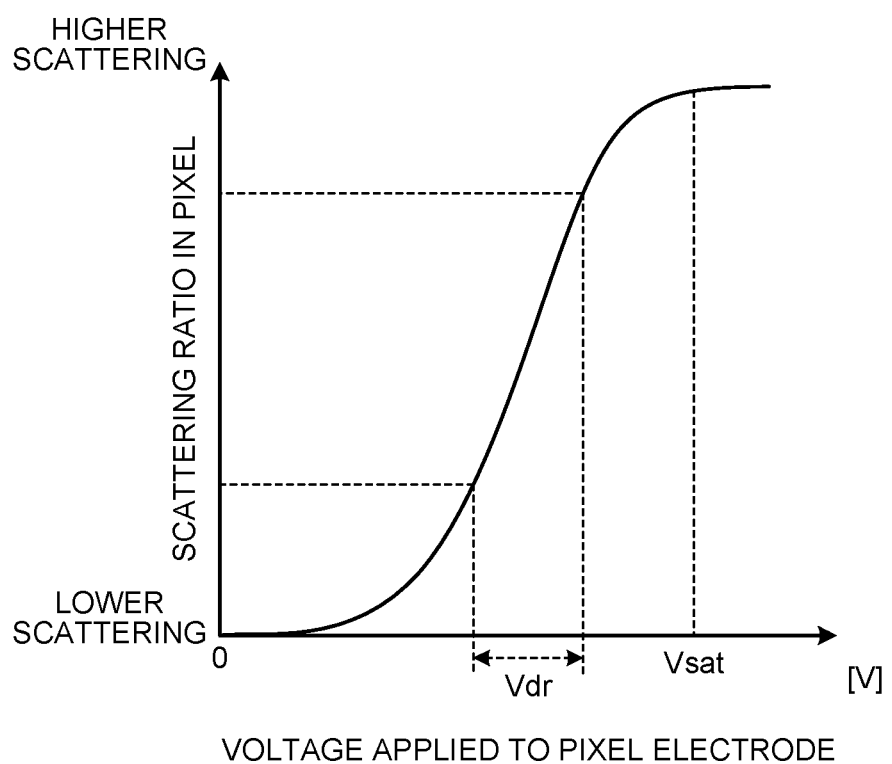
FIG. 4 is an explanatory diagram illustrating a relation between a voltage applied to a pixel electrode and a scattering state of a pixel.
Figure 6:
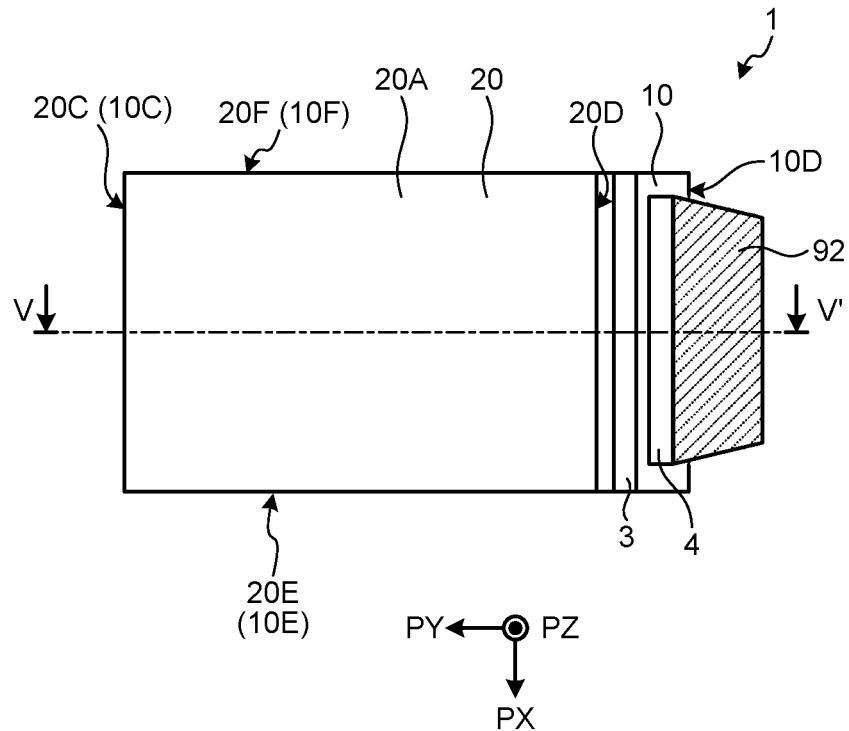
FIG. 6 is a plan view illustrating a planar surface of the display device of FIG. 1.
Figure 7:
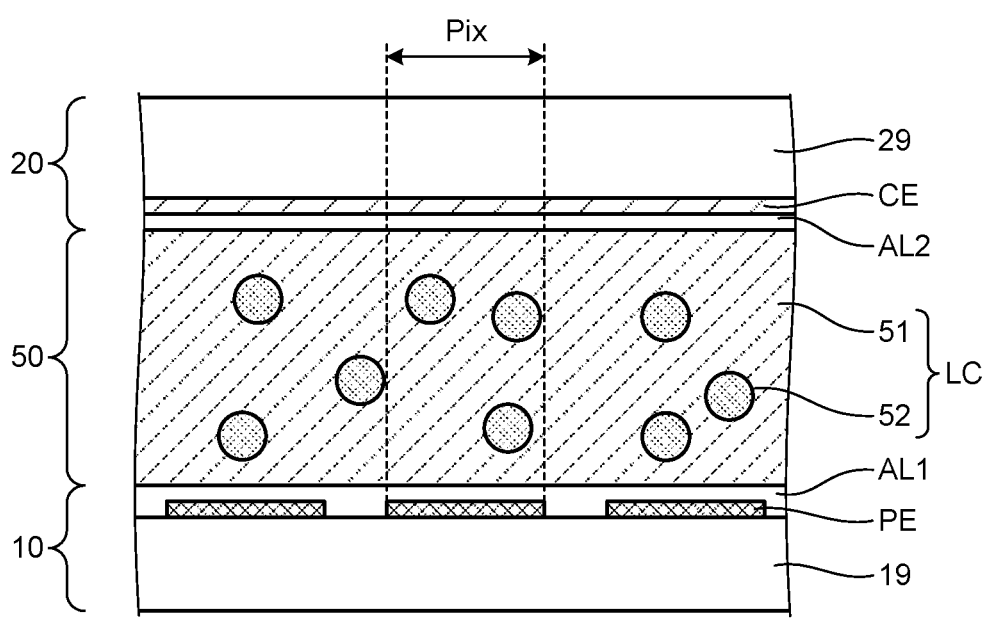
FIG. 7 is an enlarged sectional view obtained by enlarging a liquid crystal layer portion of FIG. 5.
Figure 8:
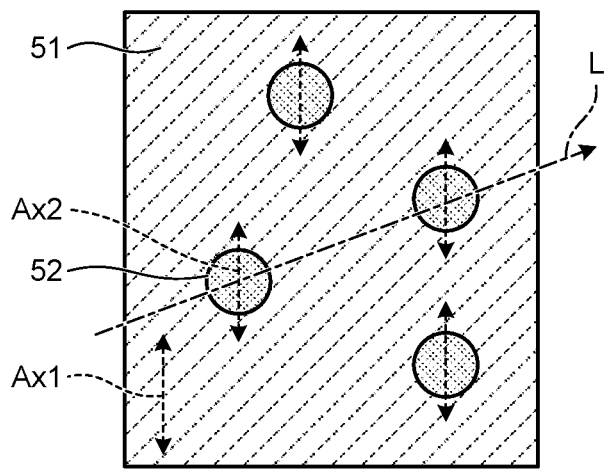
FIG. 8 is a sectional view for explaining a non-scattering state in the liquid crystal layer.
Figure 9:
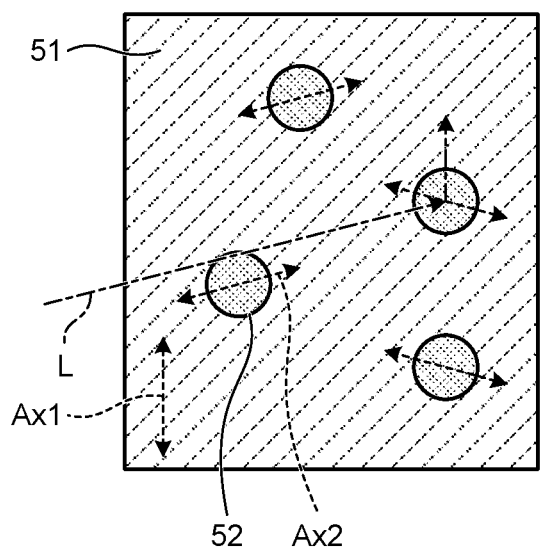
FIG. 9 is a sectional view for explaining the scattering state in the liquid crystal layer.

FIG. 4 is an explanatory diagram illustrating a relation between a voltage applied to the pixel electrode and a scattering state of the pixel. FIG. 5 is a sectional view illustrating an example of a section of the display device of FIG. 1. FIG. 6 is a plan view illustrating a planar surface of the display device of FIG. 1. FIG. 5 is a V-V' sectional view of FIG. 6. FIG. 7 is an enlarged sectional view obtained by enlarging the liquid crystal layer portion of FIG. 5. FIG. 8 is a sectional view for explaining a non-scattering state in the liquid crystal layer. FIG. 9 is a sectional view for explaining the scattering state in the liquid crystal layer.

If the gradation signal corresponding to the output gradation value of each of the pixels Pix is supplied to the above-described signal lines SL for the pixels Pix selected during the one vertical scan period GateScan, a voltage applied to the pixel electrode PE changes with the gradation signal. The change in the voltage applied to the pixel electrode PE changes the voltage between the pixel electrode PE and the common electrode CE. The scattering state of the liquid crystal layer 50 for each of the pixels Pix is controlled in accordance with the voltage applied to the pixel electrode PE, and the scattering ratio in the pixels Pix changes, as illustrated in FIG. 4.

As illustrated in FIG. 4, the change in the scattering ratio in the pixel Pix is smaller when the voltage applied to the pixel electrode PE is equal to or higher than a saturation voltage Vsat. Therefore, the drive circuit 4 changes the voltage applied to the pixel electrode PE in accordance with the vertical drive signal VDS within a voltage range Vdr lower than the saturation voltage Vsat.

As illustrated in FIGS. 5 and 6, the array substrate 10 has a first principal surface 10A, a second principal surface 10B, a first side surface 10C, a second side surface 10D, a third side surface 10E, and a fourth side surface 10F. The first principal surface 10A and the second principal surface 10B are parallel flat surfaces. The first side surface 10C and the second side surface 10D are parallel flat surfaces. The third side surface 10E and the fourth side surface 10F are parallel flat surfaces.

As illustrated in FIGS. 5 and 6, the counter substrate 20 has a first principal surface 20A, a second principal surface 20B, a first side surface 20C, a second side surface 20D, a third side surface 20E, and a fourth side surface 20F. The first principal surface 20A and the second principal surface 20B are parallel flat surfaces. The first side surface 20C and the second side surface 20D are parallel flat surfaces. The third side surface 20E and the fourth side surface 20F are parallel flat surfaces.

As illustrated in FIGS. 5 and 6, the light source 3 faces the second side surface 20D of the counter substrate 20. The light source 3 may also be called a side light source. As illustrated in FIG. 5, the light source 3 emits light-source light L to the second side surface 20D of the counter substrate 20. The second side surface 20D of the counter substrate 20 facing the light source 3 serves as a plane of light incidence.

As illustrated in FIG. 5, the light-source light L emitted from the light source 3 propagates in a direction (second direction PY) away from the second side surface 20D while being reflected by the first principal surface 10A of the array substrate 10 and the first principal surface 20A of the counter substrate 20. When the light-source light L travels outward from the first principal surface 10A of the array substrate 10 or the first principal surface 20A of the counter substrate 20, the light-source light L enters a medium having a lower refractive index from a medium having a higher refractive index. Hence, if the angle of incidence of the light-source light L incident on the first principal surface 10A of the array substrate 10 or the first principal surface 20A of the counter substrate 20 is larger than a critical angle, the light-source light L is totally reflected by the first principal surface 10A of the array substrate 10 or the first principal surface 20A of the counter substrate 20.

As illustrated in FIG. 5, the light-source light L that has propagated in the array substrate 10 and the counter substrate 20 is scattered by the pixels Pix including the liquid crystals placed in the scattering state, and the angle of incidence of the scattered light becomes an angle smaller than the critical angle. Thus, emission light 68 and 68A are emitted outward from the first principal surface 20A of the counter substrate 20 and the first principal surface 10A of the array substrate 10, respectively. A viewer views the emission light 68 or 68A emitted outward from the first principal surface 20A of the counter substrate 20 or the first principal surface 10A of the array substrate 10, respectively. The following describes the polymer-dispersed liquid crystals placed in the scattering state and the polymer-dispersed liquid crystals in the non-scattering state, using FIGS. 7 to 9.

As illustrated in FIG. 7, the array substrate 10 is provided with a first orientation film AL1. The counter substrate 20 is provided with a second orientation film AL2. The first and the second orientation films AL1 and AL2 are, for example, vertical orientation films.

A solution containing the liquid crystals and a monomer is filled between the array substrate 10 and the counter substrate 20. Then, in a state where the monomer and the liquid crystals are oriented by the first and the second orientation films AL1 and AL2, the monomer is polymerized by ultraviolet rays or heat to form a bulk 51. This process forms the liquid crystal layer 50 including the reverse-mode polymer-dispersed liquid crystals LC in which the liquid crystals are dispersed in gaps of a polymer network formed in a mesh shape.

In this manner, the polymer-dispersed liquid crystals LC include the bulk 51 formed of the polymer and a plurality of fine particles 52 dispersed in the bulk 51. The fine particles 52 are formed of the liquid crystals. Both the bulk 51 and the fine particles 52 have optical anisotropy.

The orientation of the liquid crystals included in the fine particles 52 is controlled by a voltage difference between the pixel electrode PE and the common electrode CE. The orientation of the liquid crystals is changed by the voltage applied to the pixel electrode PE. The degree of scattering of light passing through the pixels Pix changes with change in the orientation of the liquid crystals.

For example, as illustrated in FIG. 8, the direction of an optical axis AX1 of the bulk 51 is equal to the direction of an optical axis AX2 of the fine particles 52 when no voltage is applied between the pixel electrode PE and the common electrode CE. The optical axis AX2 of the fine particles 52 is parallel to the direction PZ of the liquid crystal layer 50. The optical axis AX1 of the bulk 51 is parallel to the direction PZ of the liquid crystal layer 50 regardless of whether a voltage is applied.

The bulk 51 and the liquid crystal molecules 52 have the same ordinary-ray refractive index. When no voltage is applied between the pixel electrode PE and the common electrode CE, the difference of refractive index between the bulk 51 and the fine particles 52 is zero in all directions. The liquid crystal layer 50 is placed in the non-scattering state of not scattering the light-source light L. The light-source light L propagates in a direction away from the light source 3 (the light emitter 31) while being reflected by the first principal surface 10A of the array substrate 10 and the first principal surface 20A of the counter substrate 20. When the liquid crystal layer 50 is in the non-scattering state of not scattering the light-source light L, a background on the first principal surface 20A side of the counter substrate 20 is visible from the first principal surface 10A of the array substrate 10, and a background on the first principal surface 10A side of the array substrate 10 is visible from the first principal surface 20A of the counter substrate 20.

As illustrated in FIG. 9, in the gap between the pixel electrode PE and the common electrode CE having a voltage applied thereto, the optical axis AX2 of the fine particles 52 is inclined by an electric field generated between the pixel electrode PE and the common electrode CE. Since the optical axis AX1 of the bulk 51 is not changed by the electric field, the direction of the optical axis AX1 of the bulk 51 differs from the direction of the optical axis AX2 of the fine particles 52. The light-source light L is scattered in the pixel Pix including the pixel electrode PE having a voltage applied thereto. As described above, the viewer views a portion of the scattered light-source light L emitted outward from the first principal surface 10A of the array substrate 10 or the first principal surface 20A of the counter substrate 20.

In the pixel Pix including the pixel electrode PE having no voltage applied thereto, the background on the first principal surface 20A side of the counter substrate 20 is visible from the first principal surface 10A of the array substrate 10, and the background on the first principal surface 10A side of the array substrate 10 is visible from the first principal surface 20A of the counter substrate 20. In the display device 1 of the present embodiment, when the first input signal VS is received from the image transmitter 91, the voltage is applied to the pixel electrode PE of the pixel Pix for displaying an image, and an image based on the third input signal VCSA becomes visible together with the background. In this manner, the image is displayed in the display area when the polymer-dispersed liquid crystals are in the scattering state.

The light-source light L is scattered in the pixel Pix including the pixel electrode PE having a voltage applied thereto, and emitted outward to display the image, which is displayed so as to be superimposed on the background. In other words, the display device 1 of the present embodiment displays the image so as to be superimposed on the background by combining the emission light 68 or the emission light 68A with the background.

A potential of each of the pixel electrodes PE (refer to FIG. 7) written during the one vertical scan period GateScan illustrated in FIG. 3 needs to be held during at least one of the first color light emission period RON, the second color light emission period GON, and the third color light emission period BON after the one vertical scan period GateScan. If the written potential of each of the pixel electrodes PE (refer to FIG. 7) cannot be held during at least one of the first color light emission period RON, the second color light emission period GON, and the third color light emission period BON after the one vertical scan period GateScan, what are called flickers, for example, are likely to occur. In other words, in order to shorten the one vertical scan period GateScan serving as a time for selecting the scan lines and increase the visibility in the driving based on what is called the field-sequential system, the written potential of each of the pixel electrodes PE (refer to FIG. 7) is required to be easily held during each of the first color light emission period RON, the second color light emission period GON, and the third color light emission period BON.

Figure 10:
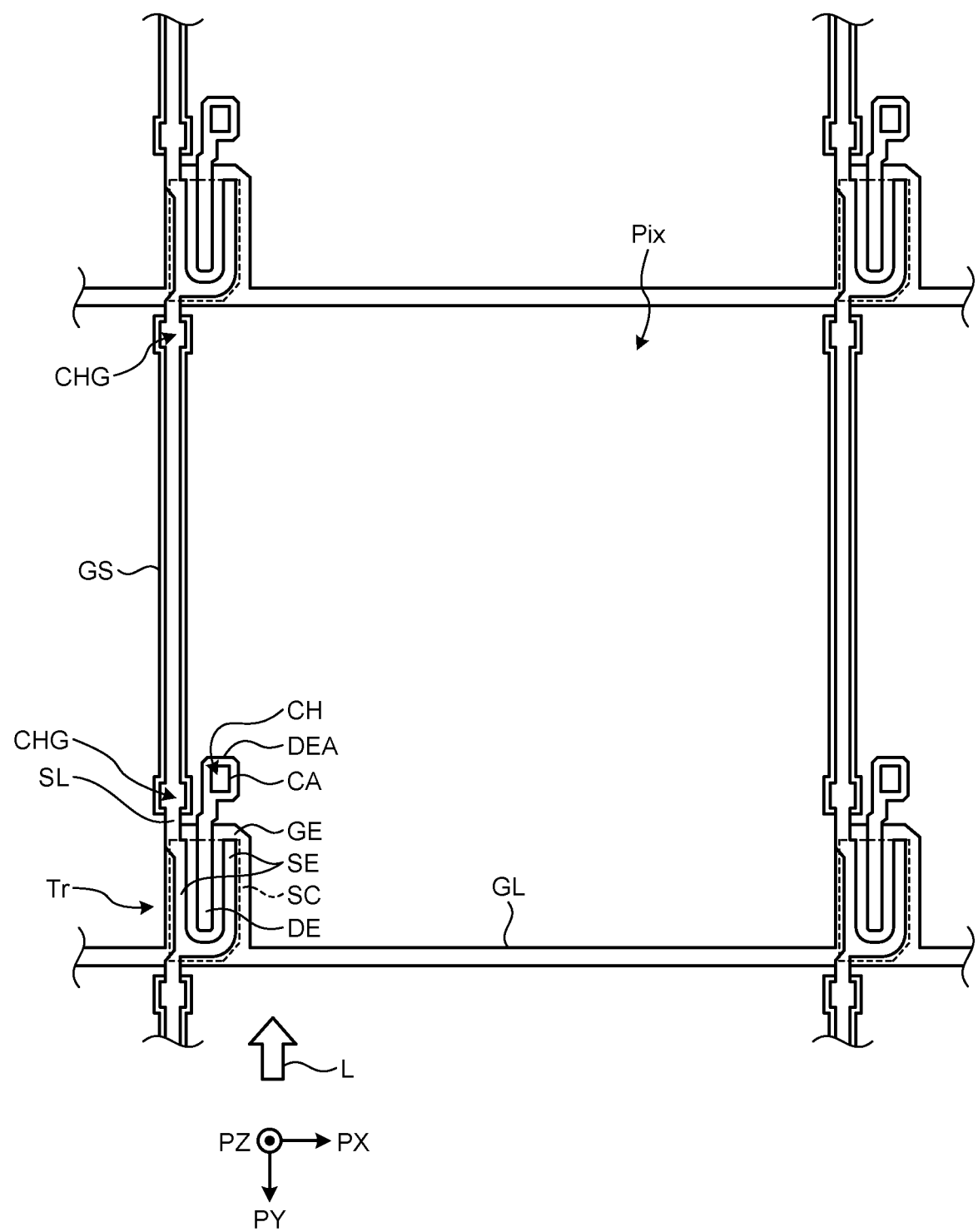
FIG. 10 is a plan view illustrating scan lines, signal lines, and a switching element in the pixel.
Figure 11:
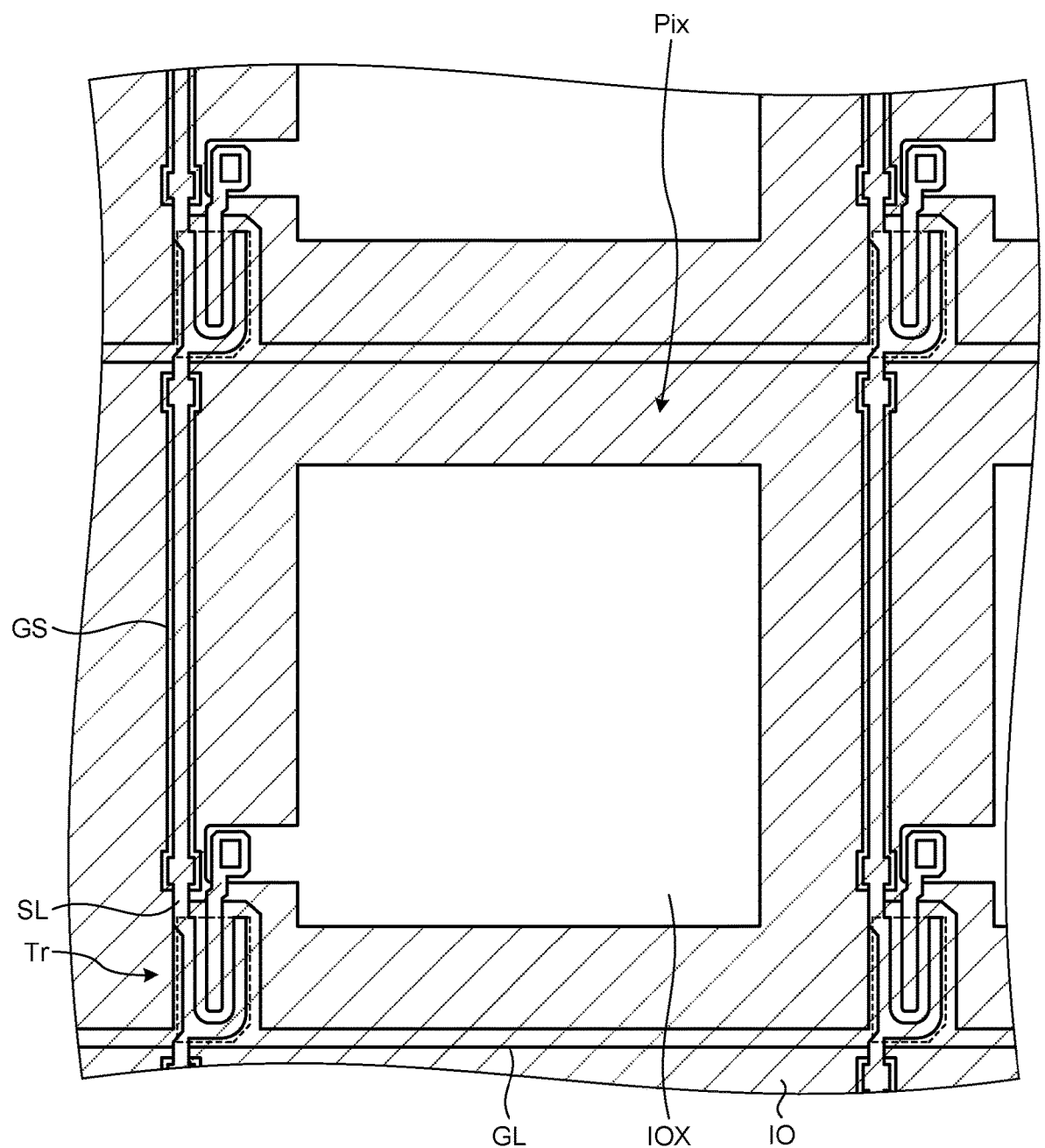
FIG. 11 is a plan view illustrating a holding capacitance layer in the pixel.
Figure 12:
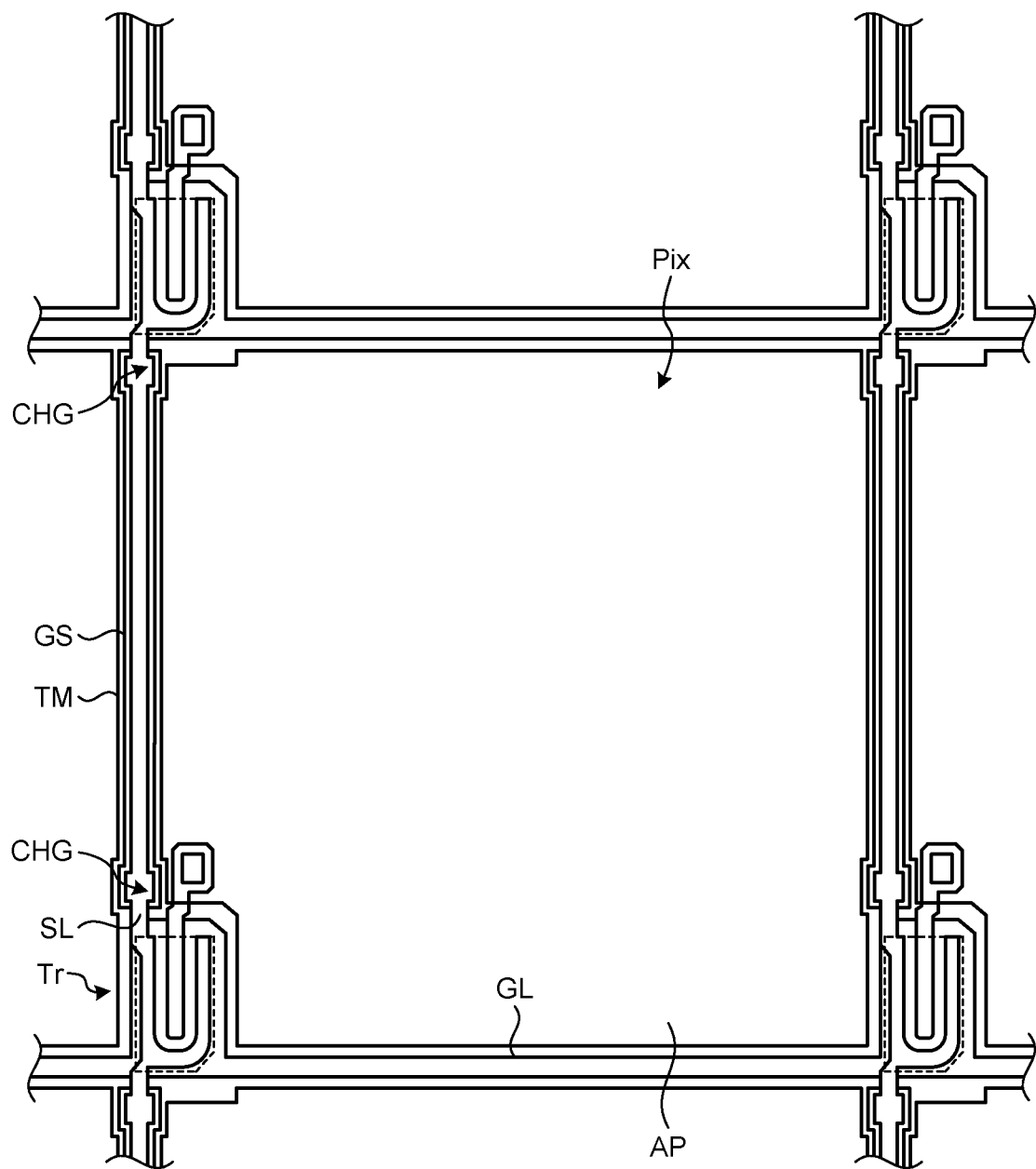
FIG. 12 is a plan view illustrating an auxiliary metal layer and an opening area in the pixel.
Figure 13:
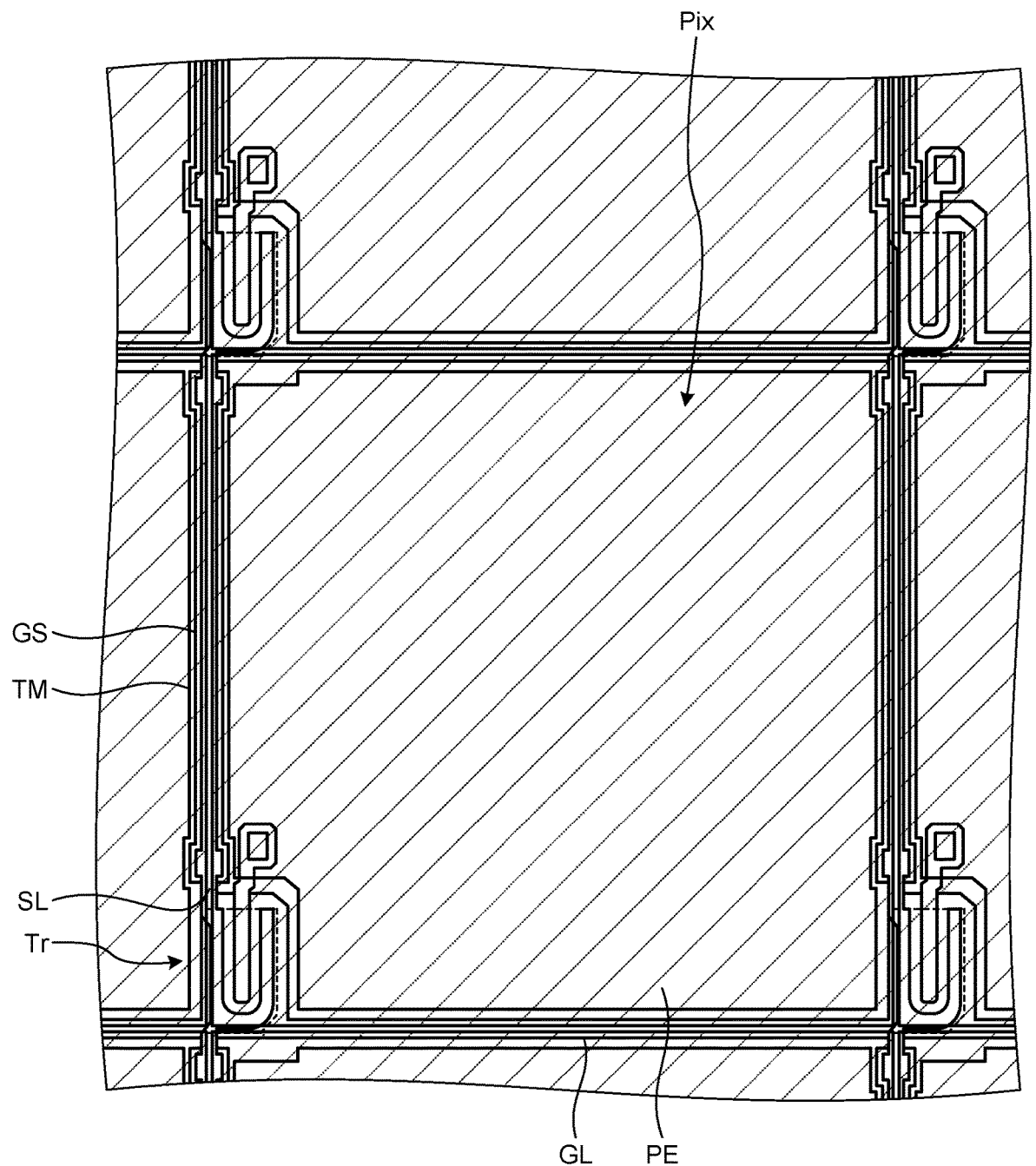
FIG. 13 is a plan view illustrating the pixel electrode in the pixel.
Figure 14:
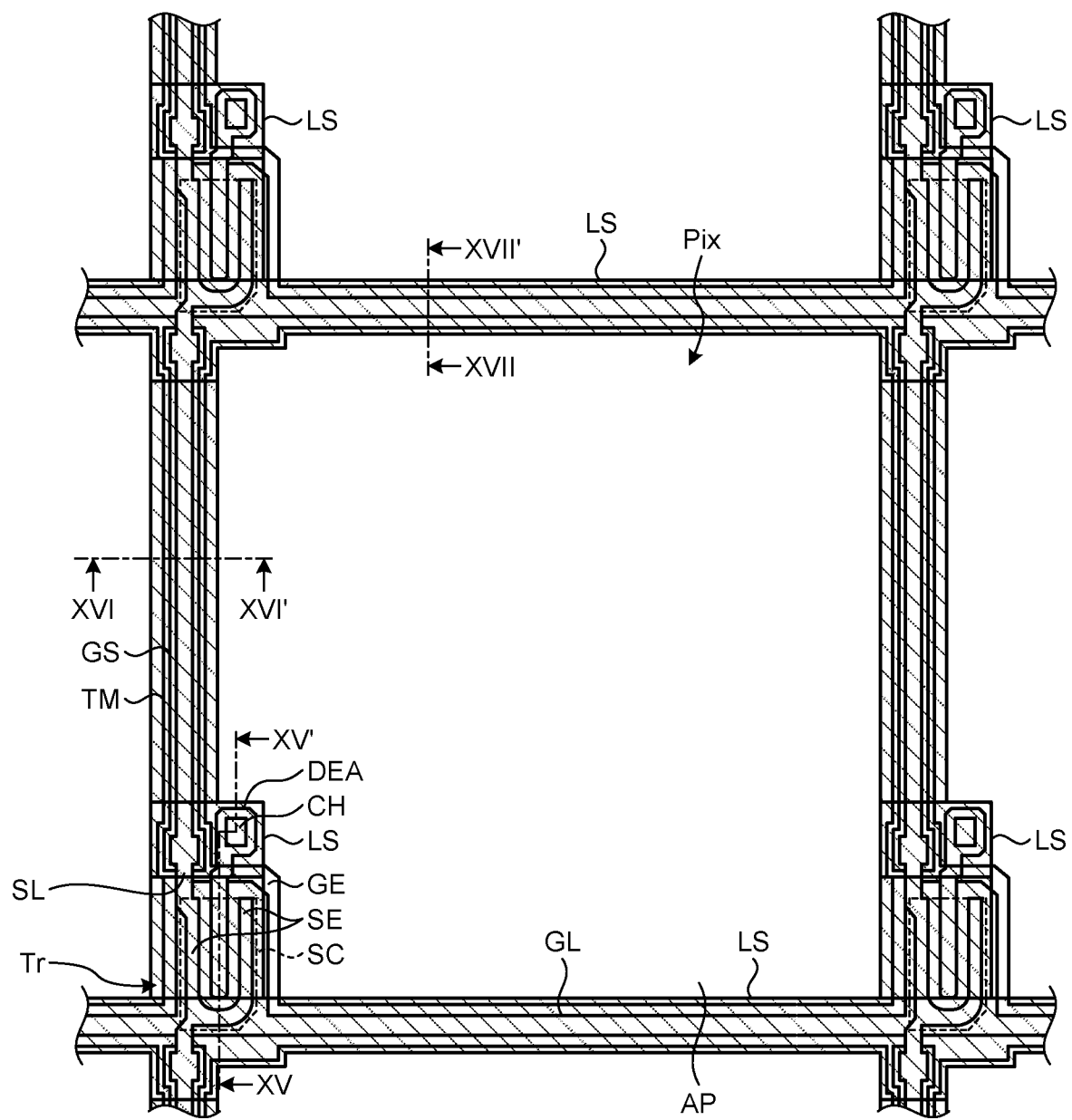
FIG. 14 is a plan view illustrating a light-blocking layer in the pixel.
Figure 15:
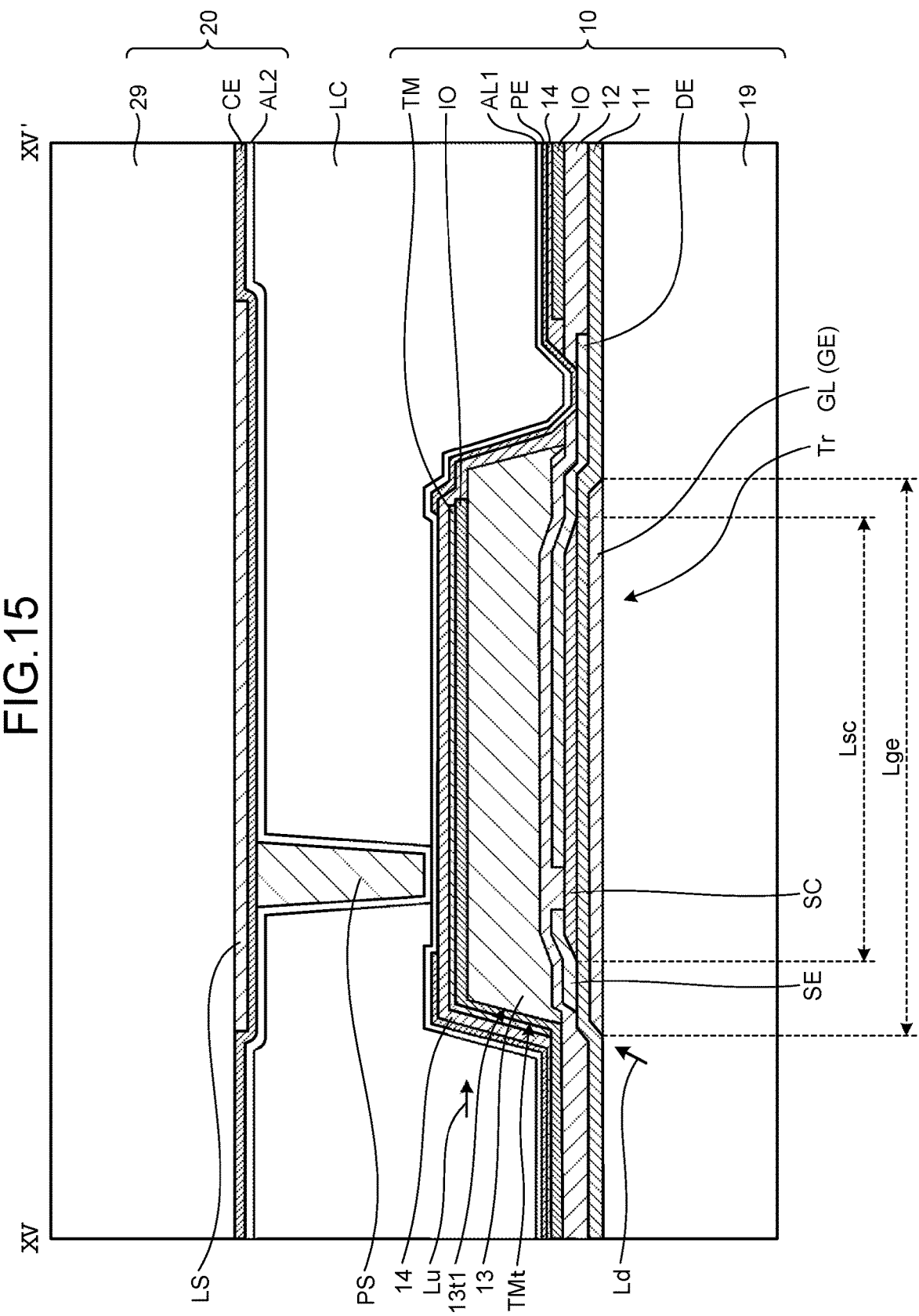
FIG. 15 is a sectional view along XV-XV' of FIG. 14.
Figure 16:
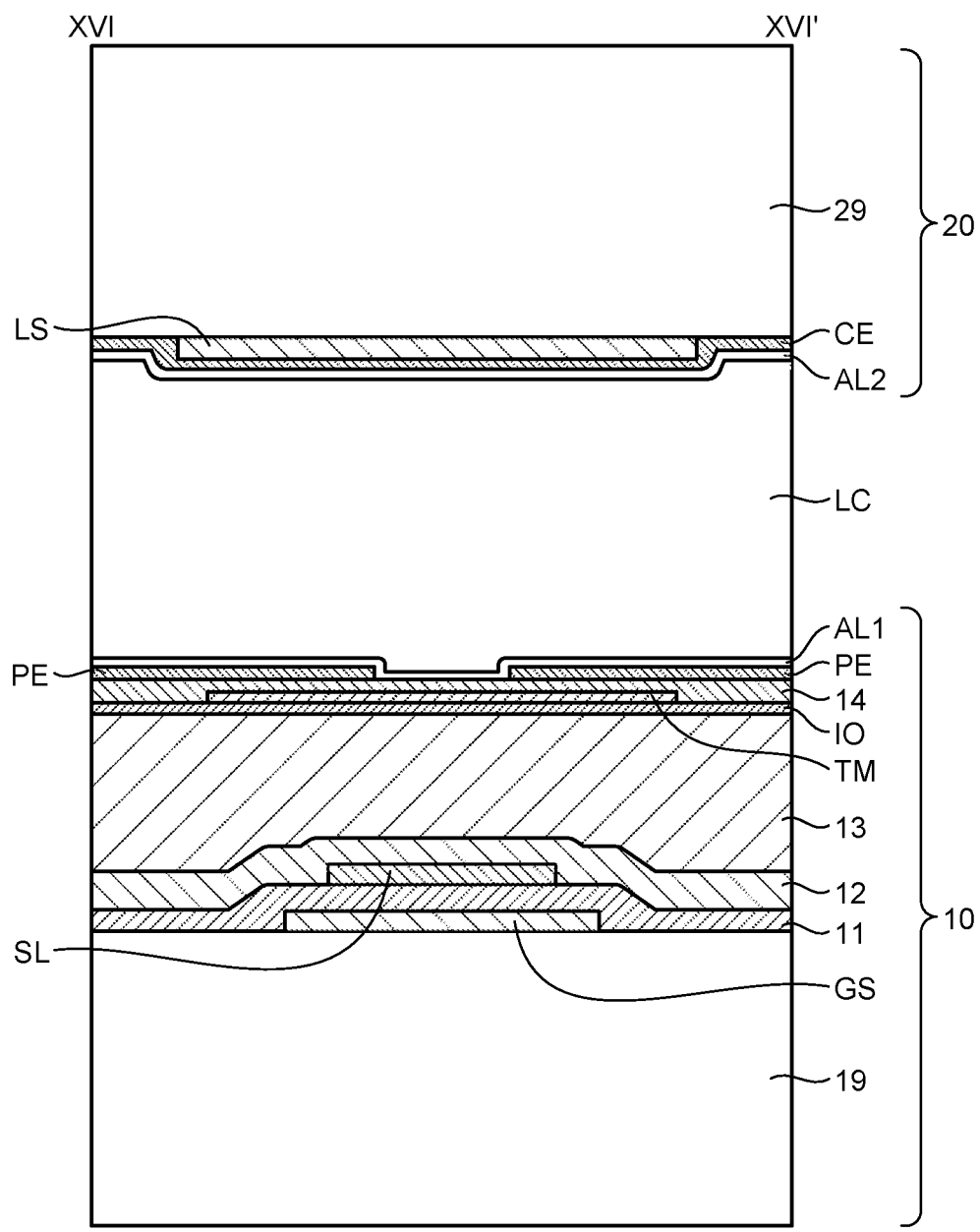
FIG. 16 is a sectional view along XVI-XVI' of FIG. 14.
Figure 17:
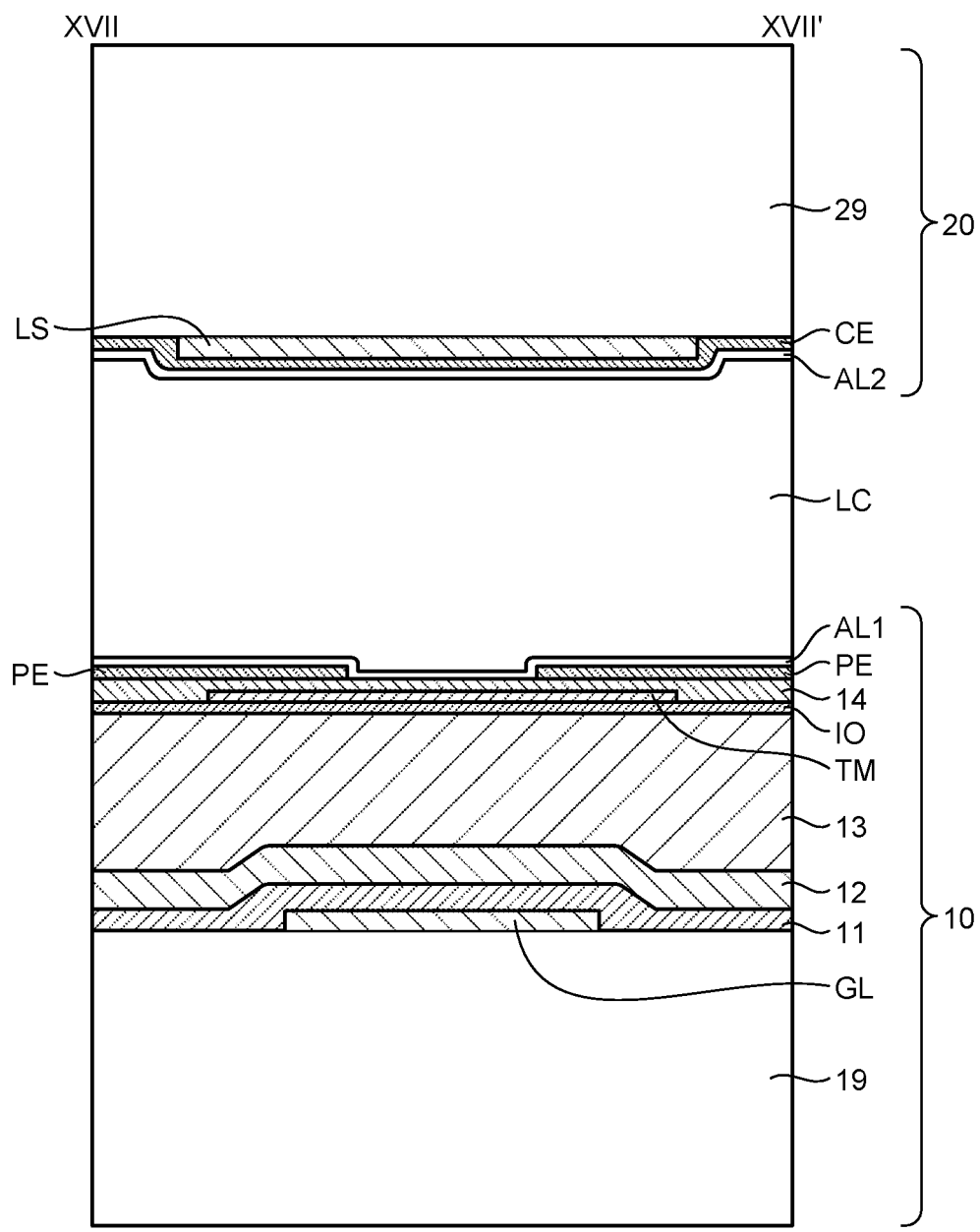
FIG. 17 is a sectional view along XVII-XVII' of FIG. 14.
Figure 18:
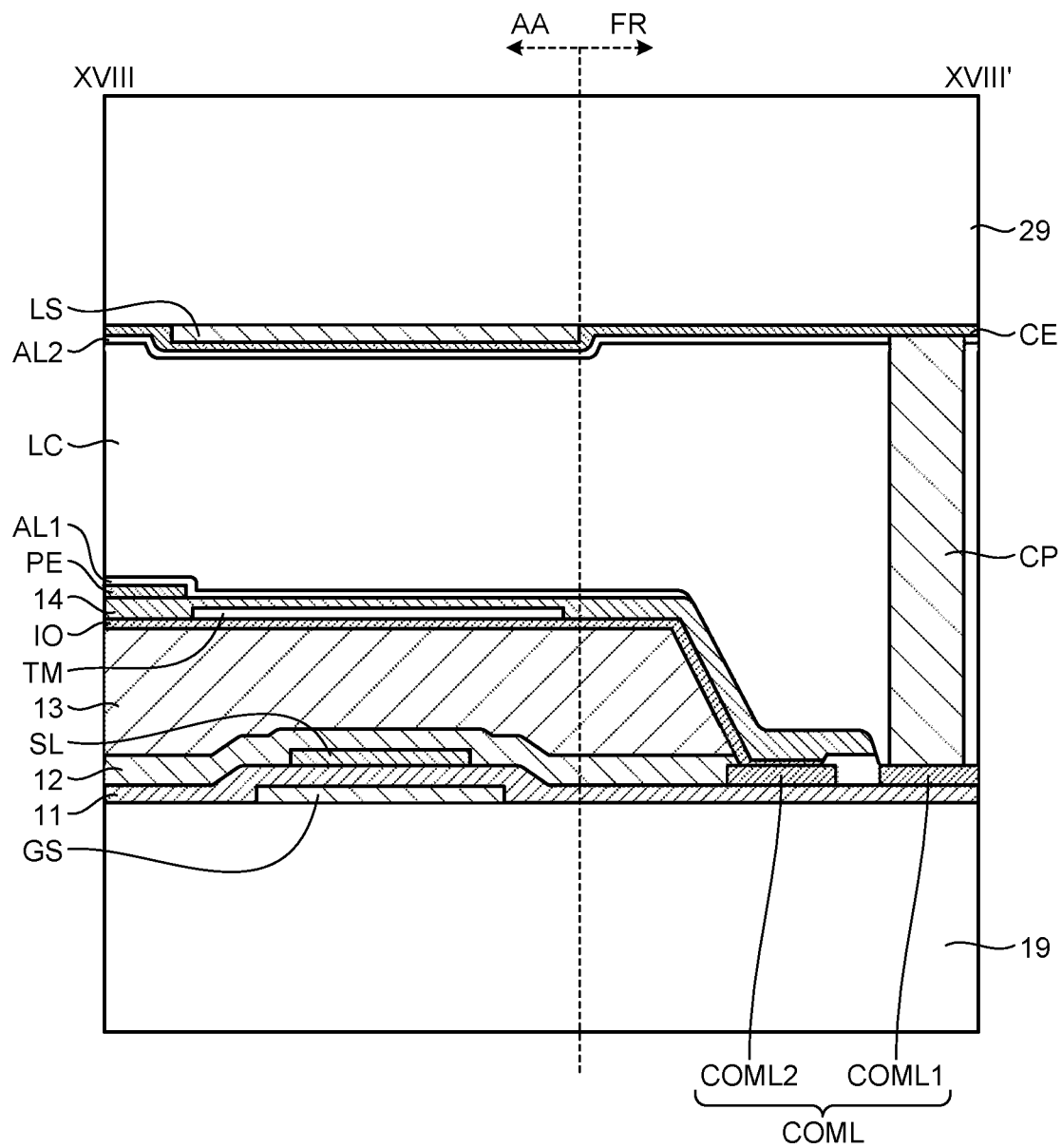
FIG. 18 is a sectional view of a peripheral area.

FIG. 10 is a plan view illustrating the scan lines, the signal lines, and the switching element in the pixel. FIG. 11 is a plan view illustrating a holding capacitance layer in the pixel. FIG. 12 is a plan view illustrating an auxiliary metal layer and an opening area in the pixel. FIG. 13 is a plan view illustrating the pixel electrode in the pixel. FIG. 14 is a plan view illustrating a light-blocking layer in the pixel. FIG. 15 is a sectional view along XV-XV' of FIG. 14. FIG. 16 is a sectional view along XVI-XVI' of FIG. 14. FIG. 17 is a sectional view along XVII-XVII' of FIG. 14. FIG. 18 is a sectional view of the peripheral area. As illustrated in FIGS. 1, 2, and 10, the array substrate 10 is provided with the signal lines SL and the scan lines GL so as to form a grid in plan view. In other words, one surface of the array substrate 10 is provided with the signal lines arranged in the first direction PX with spaces therebetween and the scan lines arranged in the second direction PY with spaces therebetween.

As illustrated in FIG. 10, an area surrounded by the adjacent scan lines GL and the adjacent signal lines SL corresponds to the pixel Pix. The pixel Pix is provided with the pixel electrode PE and the switching element Tr. In the present embodiment, the switching element Tr is a bottom-gate thin film transistor. The switching element Tr includes a semiconductor layer SC overlapping, in plan view, a gate electrode GE electrically coupled to a corresponding one of the scan lines GL.

As illustrated in FIG. 10, the scan lines GL are wiring of a metal such as molybdenum (Mo) or aluminum (Al), a multilayered body of these metals, or an alloy thereof. The signal lines SL are wiring of a metal such as aluminum or an alloy thereof.

As illustrated in FIG. 10, the semiconductor layer SC is provided so as not to protrude from the gate electrode GE in plan view. As a result, the light-source light L traveling toward the semiconductor layer SC from the gate electrode GE side is reflected, and light leakage is less likely to occur in the semiconductor layer SC.

As illustrated in FIGS. 5 and 10, the light-source light L emitted from the light source 3 is incident in the second direction PY serving as a direction of incidence. When the direction of incidence of the light-source light L is the second direction PY, the width in the first direction of the semiconductor layer SC is less than the width in the second direction of the semiconductor layer SC. This configuration reduces the width in a direction intersecting the direction of incidence of the light-source light L, and thereby, reduces the effect of the light leakage.

As illustrated in FIG. 10, two electrical conductors of a source electrode SE that are the same as the signal line SL extend from the signal line SL in the same layer as that of the signal line SL and in a direction intersecting the signal line. With this configuration, the source electrode SE electrically coupled to the signal line SL overlaps one end of the semiconductor layer SC in plan view.

As illustrated in FIG. 10, in plan view, a drain electrode DE is provided in a position between the adjacent electrical conductors of the source electrode SE. The drain electrode DE overlaps the semiconductor layer SC in plan view. A portion of the semiconductor layer SC overlapping neither the source electrode SE nor the drain electrode DE serves as a channel of the switching element Tr. As illustrated in FIG. 13, a contact electrode DEA electrically coupled to the drain electrode DE is electrically coupled to the pixel electrode PE through a contact hole CH.

As illustrated in FIG. 15, the array substrate 10 includes a first light-transmitting base member 19 formed of, for example, glass. The first light-transmitting base member 19 may be made of a resin such as polyethylene terephthalate, as long as having a light transmitting capability.

As illustrated in FIG. 15, the scan line GL (refer to FIG. 10) and the gate electrode GE are provided on the first light-transmitting base member 19. The array substrate 10 may include a protective member (not illustrated) formed of, for example, glass on a surface on a side opposite to a surface of the first light-transmitting base member 19 on which the scan line GL and the gate electrode GE are provided. The protective member may be made of a resin, as long as having light transmitting capability.

In addition, as illustrated in FIG. 15, a first insulating layer 11 is provided so as to cover the scan line GL and the gate electrode GE. The first insulating layer 11 is formed of, for example, a transparent inorganic insulating material such as silicon nitride.

The semiconductor layer SC is stacked on the first insulating layer 11. The semiconductor layer SC is formed of, for example, amorphous silicon, but may be formed of polysilicon or an oxide semiconductor. When viewed in the same section, a width Lsc of the semiconductor layer SC is less than a width Lge of the gate electrode GE overlapping the semiconductor layer SC. With this configuration, the gate electrode GE can block light Ld that has propagated in the first light-transmitting base member 19. As a result, the light leakage of the switching element Tr of the present embodiment is reduced.

The source electrode SE and the signal line SL covering a portion of the semiconductor layer SC and the drain electrode DE covering a portion of the semiconductor layer SC are provided on the first insulating layer 11. The drain electrode DE is formed of the same material as that of the signal line SL. A second insulating layer 12 is provided on the semiconductor layer SC, the signal line SL, and the drain electrode DE. The second insulating layer 12 is formed of, for example, a transparent inorganic insulating material such as silicon nitride, in the same manner as the first insulating layer 11.

A third insulating layer covering a portion of the second insulating layer 12 is formed on the second insulating layer 12. A third insulating layer 13 is formed of, for example, a light-transmitting organic insulating material such as an acrylic resin. The third insulating layer 13 has a film thickness greater than other insulating films formed of an inorganic material.

As illustrated in FIGS. 15, 16, and 17, some areas have the third insulating layer 13 while the other areas do not have the third insulating layer 13. As illustrated in FIGS. 16 and 17, the areas having the third insulating layer 13 are located over the scan lines GL and over the signal lines SL. The third insulating layer 13 has a grid shape along the scan lines GL and the signal lines SL and covers over the scan lines GL and the signal lines SL. As illustrated in FIG. 15, the areas having the third insulating layer 13 are also located over the semiconductor layer SC, that is, over the switching elements Tr. As a result, the switching element Tr, the scan line GL, and the signal line SL are located at relatively long distances from the holding capacitance electrode IO, and are thereby less affected by a common potential from the holding capacitance electrode IO. In addition, areas on the array substrate 10 not having the third insulating layer 13 are provided in the areas surrounded by the scan lines GL and the signal lines SL. Thus, areas are provided in which the thickness of the insulating layer is less than the thickness of the insulating layer overlapping the signal lines SL and the scan lines GL in plan view. The areas surrounded by the scan lines GL and the signal lines SL have relatively higher optical transmittance than the areas over the scan lines GL and over the signal lines SL, and thus, are improved in light transmitting capability.

As illustrated in FIG. 15, the holding capacitance electrode IO is provided on the third insulating layer 13. The holding capacitance electrode IO is formed of a light-transmitting conductive material such as indium tin oxide (ITO). The holding capacitance electrode IO is also called "third light-transmitting electrode". As illustrated in FIG. 11, the holding capacitance electrode IO has an area IOX including no light-transmitting conductive material in each of the areas surrounded by the scan lines GL and the signal lines SL. The holding capacitance electrode IO extends across the adjacent pixels Pix and is provided over the pixels Pix. An area of the holding capacitance electrode IO including the light-transmitting conductive material overlaps the scan line GL or the signal line SL, and extends to the adjacent pixel Pix.

The holding capacitance electrode IO has a grid shape that covers over the scan lines GL and the signal lines SL along the scan lines GL and the signal lines SL. With this configuration, the holding capacitance HC between the area IOX including no light-transmitting conductive material and the pixel electrode PE is reduced. Therefore, the holding capacitance HC is adjusted by the size of the area IOX including no light-transmitting conductive material.

As illustrated in FIG. 15, a conductive metal layer TM is provided on a portion of the holding capacitance electrode IO. The conductive metal layer TM is wiring of a metal such as molybdenum (Mo) or aluminum (Al), a multilayered body of these metals, or an alloy thereof. As illustrated in FIG. 12, the metal layer TM is provided in areas overlapping the signal lines SL, the scan lines GL, and the switching elements Tr in plan view. With this configuration, the metal layer TM is formed into a grid shape, and openings AP surrounded by the metal layer TM are formed.

As illustrated in FIG. 12, the switching element Tr coupled to the scan line GL and the signal line SL is provided. At least the switching element Tr is covered with the third insulating layer 13 serving as an organic insulating layer, and the metal layer TM having a larger area than that of the switching element Tr is located above the third insulating layer 13. This configuration can reduce the light leakage of the switching element Tr.

The metal layer TM may be located below the holding capacitance electrode IO and only needs to be stacked with the holding capacitance electrode IO. The metal layer TM has a lower electrical resistance than that of the holding capacitance electrode IO. Therefore, the potential of the holding capacitance electrode IO is restrained from varying with the position where the pixel Pix is located in the display area AA.

As illustrated in FIG. 12, the width of the metal layer TM overlapping the signal line SL is greater than the width of the signal line SL in plan view. This configuration restrains reflected light reflected by edges of the signal line SL from being emitted from the display panel 2. The width of the metal layer TM and the width of the signal line SL are lengths in a direction intersecting the extending direction of the signal line SL. The width of the metal layer TM overlapping the scan line GL is greater than the width of the scan line GL. The width of the metal layer TM and the width of the scan line GL are lengths in a direction intersecting the extending direction of the scan line GL.

As illustrated in FIG. 15, a fourth insulating layer 14 is provided on the upper side of the holding capacitance electrode IO and the metal layer TM. The fourth insulating layer 14 is an inorganic insulating layer formed of, for example, a transparent inorganic insulating material such as silicon nitride.

As illustrated in FIG. 15, the pixel electrode PE is provided on the fourth insulating layer 14. The pixel electrode PE is formed of a light-transmitting conductive material such as ITO. The pixel electrode PE is electrically coupled to the contact electrode DEA through the contact hole CH provided in the fourth insulating layer 14, the third insulating layer 13, and the second insulating layer 12. As illustrated in FIG. 13, the pixel electrodes PE are partitioned into each of the pixels Pix. The first orientation film AL1 is provided on the upper side of the pixel electrode PE.

As illustrated in FIG. 15, the counter substrate 20 includes a second light-transmitting base member 29 formed of, for example, glass. The second light-transmitting base member 29 may be made of a resin such as polyethylene terephthalate, as long as having a light transmitting capability. The second light-transmitting base member 29 is provided with the common electrode CE. The common electrode CE is formed of a light-transmitting conductive material such as ITO. The second orientation film AL2 is provided on a surface of the common electrode CE. The counter substrate 20 includes a light-blocking layer LS between the second light-transmitting base member 29 and the common electrode CE. The light-blocking layer LS is formed of a resin or a metal material colored in black. A spacer PS is formed between the array substrate 10 and the counter substrate 20. The spacer PS is located between the common electrode CE and the second orientation film AL2.

As illustrated in FIGS. 12 and 16, in the display device of the present embodiment, a light-blocking layer GS located in the same layer as that of the scan line GL is provided in a position extending along the signal line SL and overlapping part of the signal line SL. The light-blocking layer GS is formed of the same material as that of the scan line GL. The light-blocking layer GS is not provided at a portion where the scan line GL intersects the signal line SL in plan view.

As illustrated in FIG. 12, the light-blocking layer GS is electrically coupled to the signal line SL through contact holes CHG. With this configuration, the wiring resistance obtained by the light-blocking layer GS and the signal line SL is lower than that of only the signal line SL. As a result, the delay of the gradation signal supplied to the signal line SL is reduced. The contact holes CHG may not be provided, and the light-blocking layer GS may not be coupled to the signal line SL.

As illustrated in FIG. 16, the light-blocking layer GS is provided opposite to the metal layer TM with the signal line SL therebetween. The width of the light-blocking layer GS is greater than that of the signal line SL and less than that of the metal layer TM. The width of the light-blocking layer GS, the width of the metal layer TM, and the width of the signal line SL are lengths in a direction intersecting the extending direction of the signal line SL. In this manner, the light-blocking layer GS has a width greater than that of the signal line SL, and thus, restrains the reflected light reflected by the edges of the signal line SL from being emitted from the display panel 2. As a result, the visibility of images is improved in the display device 1.

As illustrated in FIGS. 14 and 15, the counter substrate 20 is provided with the light-blocking layer LS. The light-blocking layer LS is provided in an area overlapping the signal lines SL, the scan lines GL, and the switching elements Tr in plan view. The counter substrate 20 may include a protective member (not illustrated) formed of, for example, glass, on a surface opposite to a surface of the second light-transmitting base member 29 on which the common electrode CE and the light-blocking layer LS are provided. The protective member may be made of a resin, as long as having light transmitting capability.

As illustrated in FIGS. 14, 15, 16, and 17, the light-blocking layer LS has a width greater than that of the metal layer TM. This configuration restrains reflected light reflected by edges of the signal line SL, the scan line GL, and the metal layer TM from being emitted from the display panel 2. As a result, the visibility of images is improved in the display device 1.

The contact hole CH and the contact holes CHG are likely to diffusely reflect the light-source light L emitted thereto. Therefore, the light-blocking layer LS is provided in an area overlapping the contact hole CH and the contact holes CHG in plan view.

As illustrated in FIG. 15, the spacer PS is disposed between the array substrate 10 and the counter substrate 20 and improves the uniformity of the distance between the array substrate 10 and the counter substrate 20.

As illustrated in FIG. 18, the common potential wiring COML is drawn in the peripheral area FR. The common potential wiring COML includes, for example, first common potential wiring COML1 and second common potential wiring COML2. The first common potential wiring COML1 is electrically coupled to the common electrode CE of the counter substrate 20 through a conductive member CP having electrical conductivity. The conductive member CP may be a conductive pillar, or may be a sealing material containing conductive particles such as Au particles.

As illustrated in FIG. 18, in the peripheral area FR, the holding capacitance electrode IO is electrically coupled to the second common potential wiring COML2. The metal layer TM is located in the display area AA.

Figure 19:
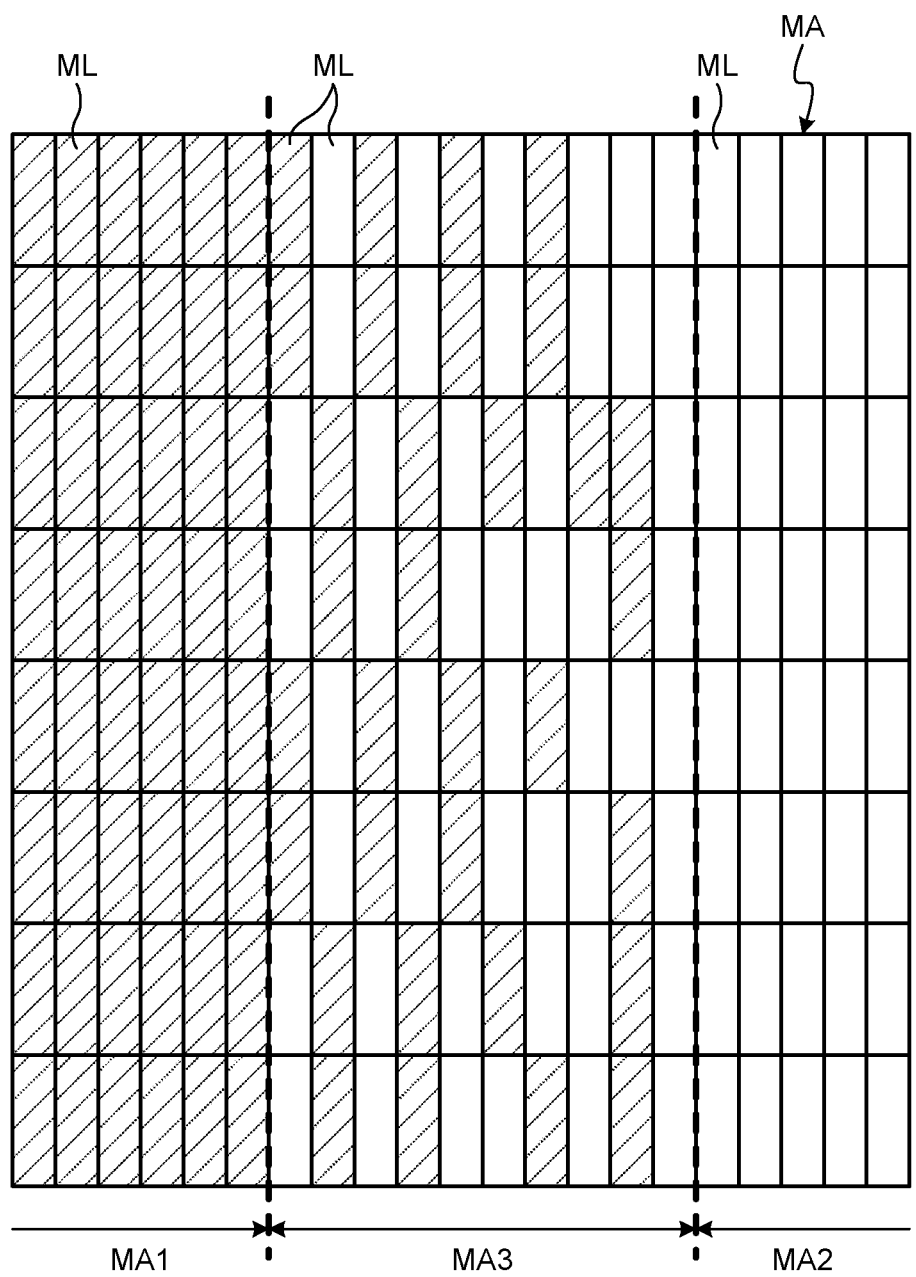
FIG. 19 is an explanatory diagram for explaining an exposure area of the display device of the present embodiment.

FIG. 19 is an explanatory diagram for explaining an exposure area of the display device of the present embodiment. For example, an exposure device specifies an area in which a photoresist is to be exposed among a plurality of exposure areas based on layout data (numerical data) created by, for example, computer-aided design (CAD), and exposes the entire area of a mother glass substrate while scanning the entire area with a light source of the exposure device. The exposure device includes a movement controller for moving the relative positions of the light source and the mother substrate, and a light controller for controlling the irradiation and non-irradiation of light from the light source based on the numerical data (design values) prepared in advance.

To shorten the exposure time, the display device is produced using a plurality of light sources. As illustrated in FIG. 19, an exposure area MA is divided into a first exposure area MA1 and a second exposure area MA2, and two independent light sources expose the first exposure area MA1 and the second exposure area MA2 in parallel. A first light source exposes the first exposure area MA1, and a second light source exposes the second exposure area MA2.

In a boundary area MA3 between the first exposure area MA1 and the second exposure area MA2, exposure misalignment may occur, thereby causing large variations in dimensions of patterns. Even if a first photomask is used to expose the first exposure area MA1 and a second photomask is subsequently used to expose the second exposure area MA2 using the same light source, the exposure misalignment may occur in the boundary area MA3, thereby causing large variations in dimensions of patterns in the same manner. To reduce the effect of the exposure misalignment, in the boundary area MA3, a plurality of first small areas ML that are portions of the first exposure area and a plurality of second small areas ML that are portions of the second exposure area are exposed so as to be arranged in a checkerboard pattern or a mosaic pattern. If the metal layer to be formed is affected by the exposure misalignment, the metal layer to be formed is exposed to a degree equal to or higher than a designed value, or is not exposed to a degree equal to or higher than the designed value, and thus, the width of the metal layer located at the boundary (boundary area MA3) of the exposure areas may be made thinner or thicker than the width of the metal layer in the exposure area. In addition, the metal layer located at the boundary (boundary area MA3) of the exposure areas may be formed so as to be shifted in the first direction PX or the second direction PY in plan view with respect to the metal layer in the exposure area.

By performing the exposure as illustrated in FIG. 19, the exposure misalignment of the exposure area MA of the mother substrate is reduced, although the exposure misalignment remains on a small-area-ML basis in the boundary area MA3. However, the light-blocking layer GS and the signal line SL are formed so as to overlap each other in plan view. Therefore, if the boundary area MA3 when forming the light-blocking layer GS and the boundary area MA3 when forming the signal line SL are located in the same position, the portions having the exposure misalignment overlap each other. In that case, portions of metal layers affected by the exposure misalignment (positional misalignment portions of metal layers) overlap each other, and thus, light reflecting portions overlap each other, which may partially increase the degree of noise recognition and degrade display quality, depending on the direction of incidence of external light. The signal lines SL and the metal layer TM are formed so as to overlap each other in plan view. Therefore, if the boundary area MA3 when forming the signal lines SL and the boundary area MA3 when forming the metal layer TM are located in the same position, the portions having the exposure misalignment overlap each other. In that case, the portions of the metal layers affected by the exposure misalignment (positional misalignment portions of metal layers) overlap each other, and thus, the light reflecting portions overlap each other. In the same manner, since the scan lines GL overlap the metal layer TM in plan view, the portions of metal layers affected by the exposure misalignment (positional misalignment portions of metal layers) overlap each other, and thus, the light reflecting portions overlap each other. In the present embodiment, the display device is manufactured so as to reduce the number of the overlapping light reflecting portions.

Figure 20:
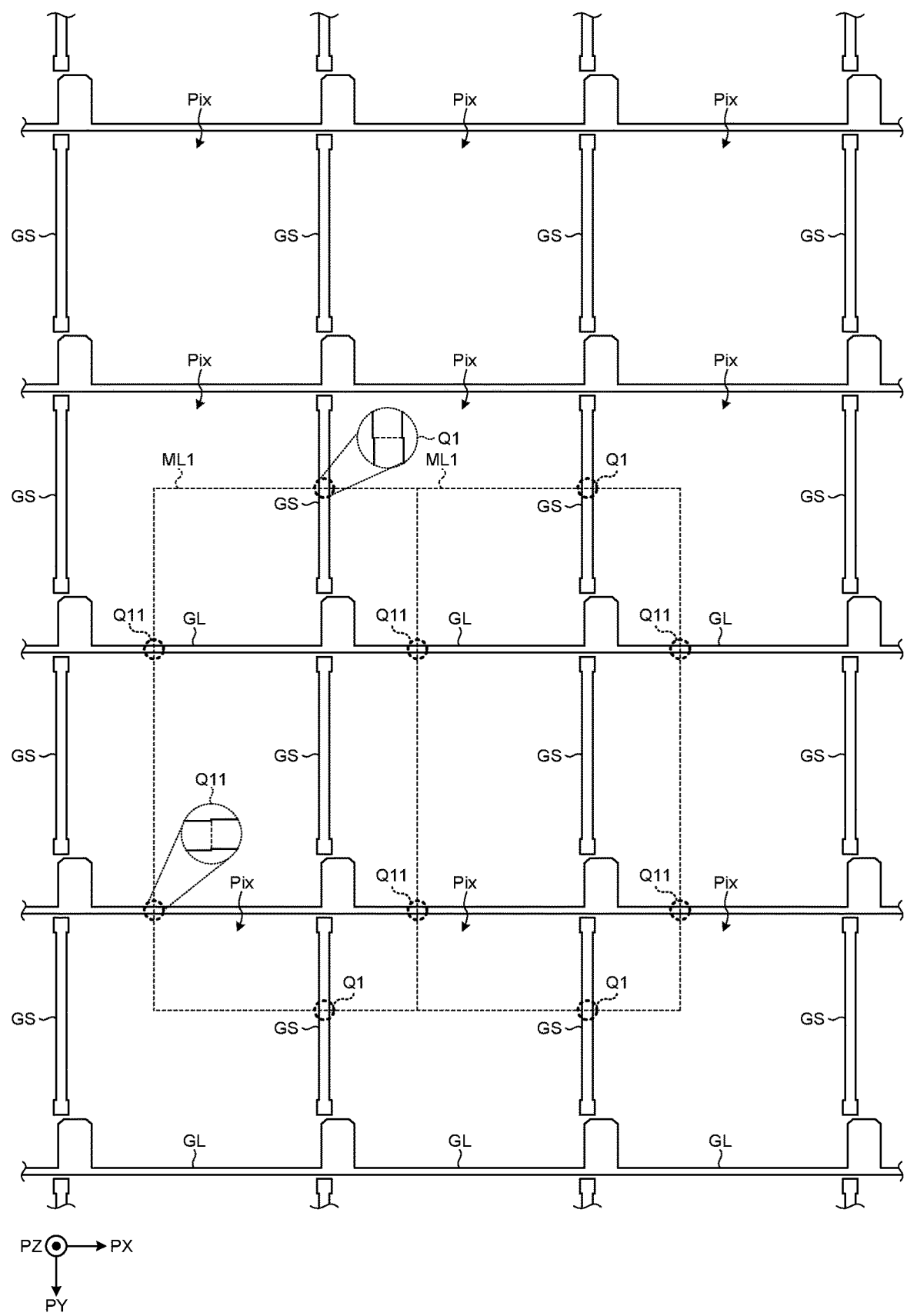
FIG. 20 is a plan view illustrating a first metal layer of the present embodiment.
Figure 21:
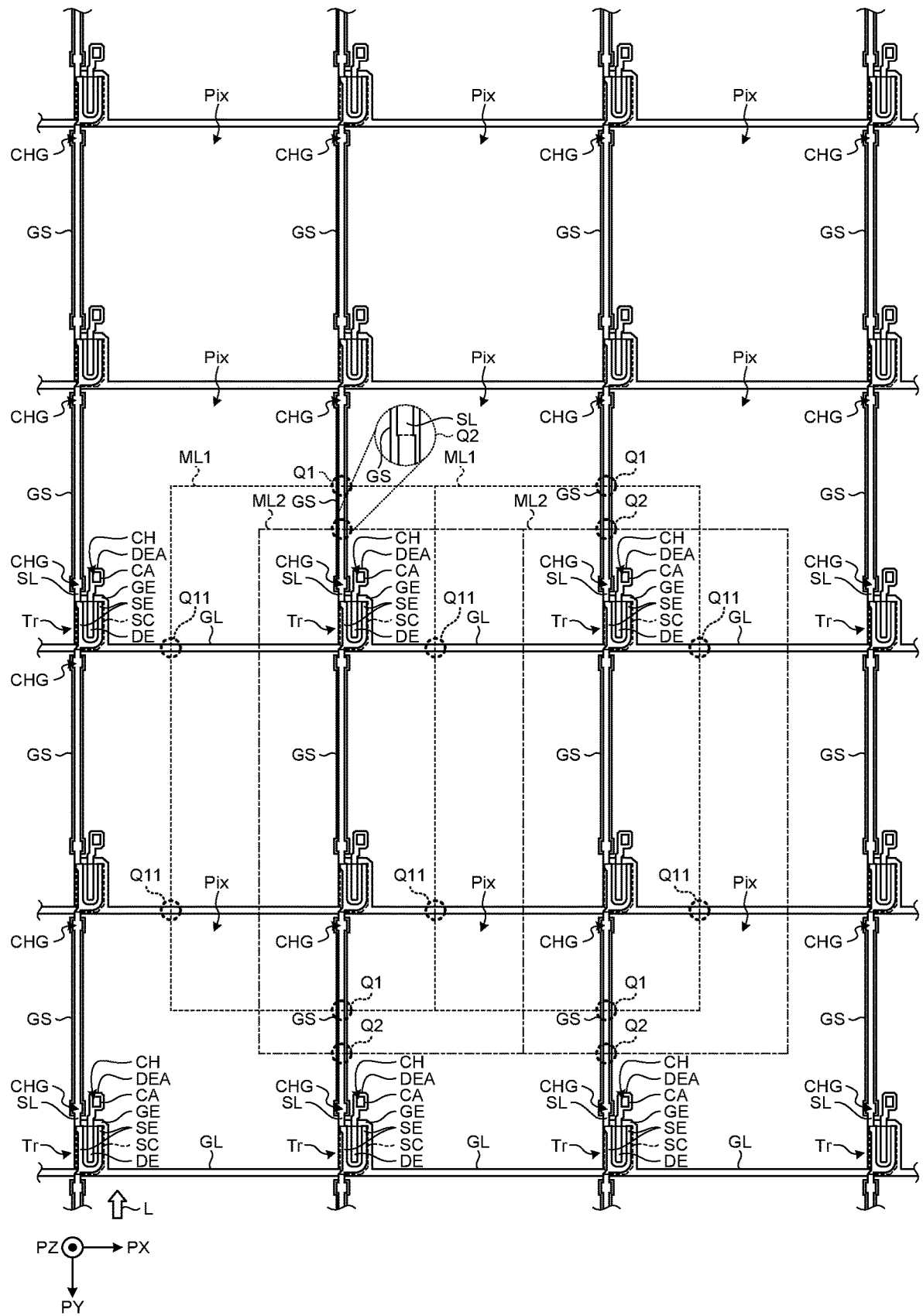
FIG. 21 is a plan view illustrating a second metal layer of the present embodiment.
Figure 22:
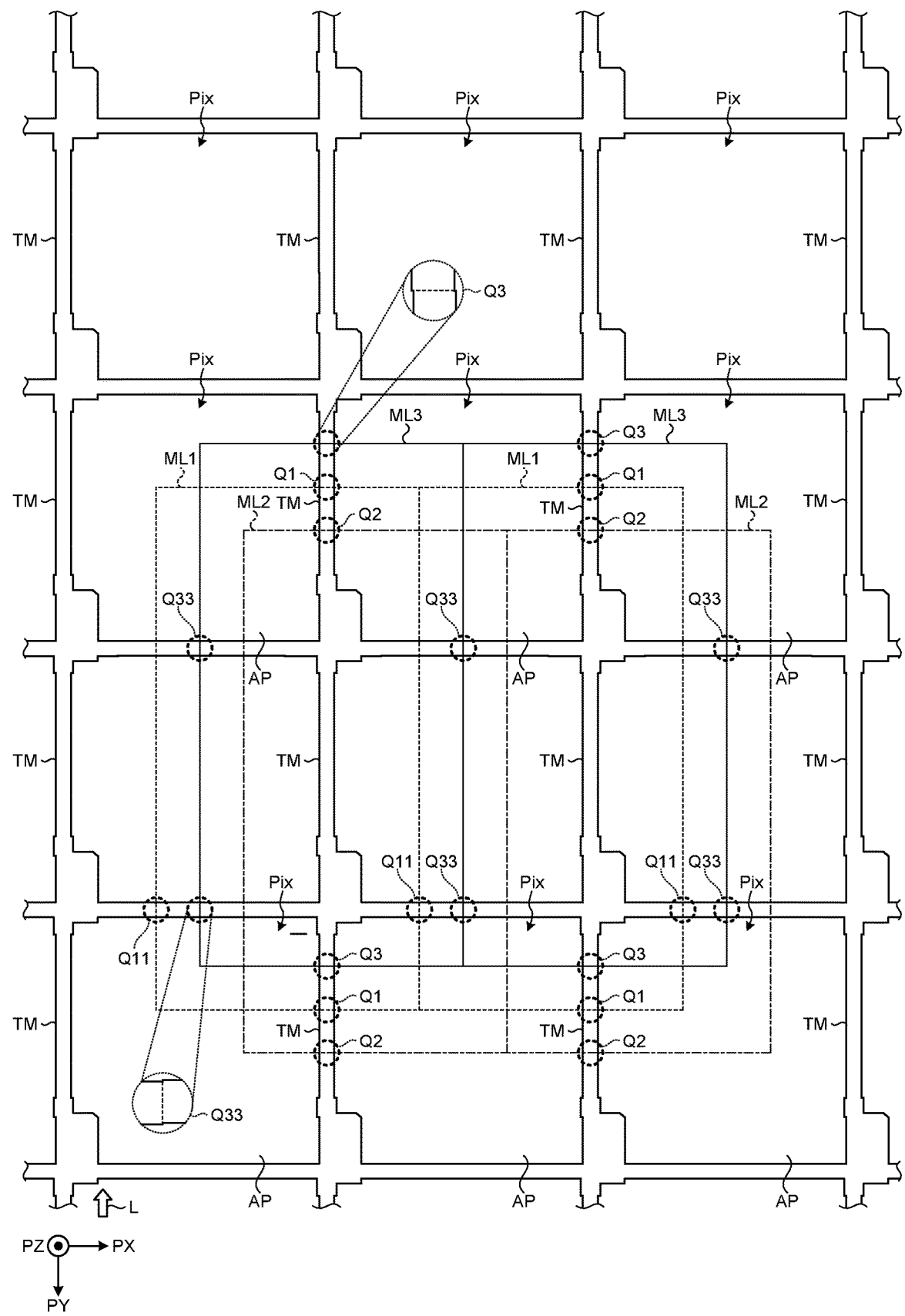
FIG. 22 is a plan view illustrating a third metal layer of the present embodiment.
Figure 23:
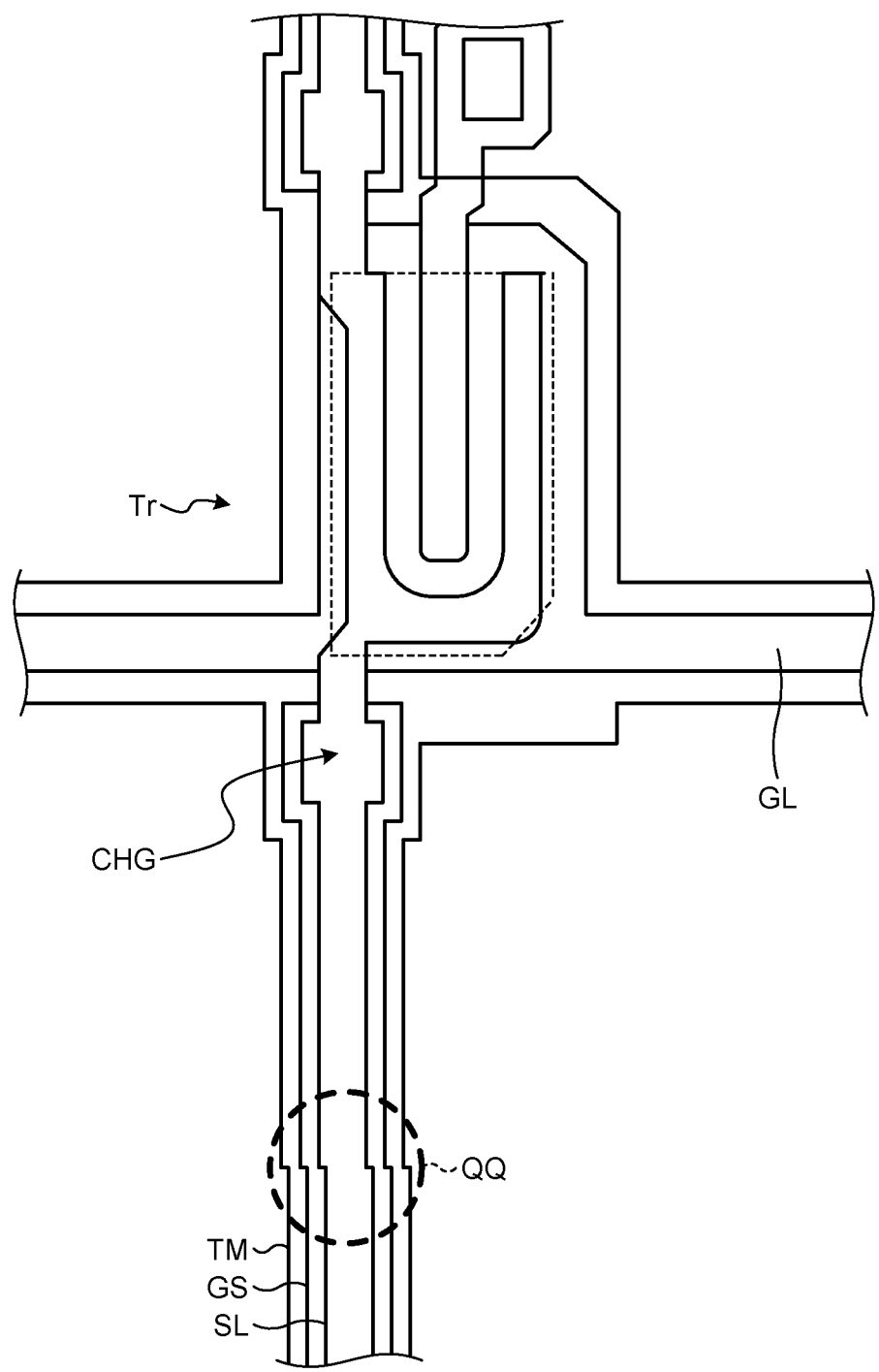
FIG. 23 is a schematic view schematically illustrating the first metal layer, the second metal layer, and the third metal layer of a comparative example.

FIG. 20 is a plan view illustrating a first metal layer of the present embodiment. In FIG. 20, the first metal layer is the scan lines GL and the light-blocking layer GS. FIG. 21 is a plan view illustrating a second metal layer of the present embodiment. In FIG. 21, the second metal layer is the signal lines SL. FIG. 22 is a plan view illustrating a third metal layer of the present embodiment. FIG. 23 is a schematic view schematically illustrating the first metal layer, the second metal layer, and the third metal layer of a comparative example.

As illustrated in FIG. 20, two small areas ML1 of the small areas ML (refer to FIG. 19) are illustrated so as to overlap the layout of the scan lines GL and the light-blocking layer GS. The small areas ML1 are used for the exposure of the scan lines GL and the light-blocking layer GS. An intersecting portion Q1 between the outer edge of the small area ML1 and the light-blocking layer GS serving as the first metal layer corresponds to a portion affected by the exposure misalignment (positional misalignment portion of the metal layer). In the same manner, an intersecting portion Q11 between the outer edge of the small area ML1 and the scan line GL serving as the first metal layer corresponds to a portion affected by the exposure misalignment (positional misalignment portion of the metal layer).

As illustrated in FIG. 21, two small areas ML2 of the small areas ML (refer to FIG. 19) are illustrated so as to overlap the layout of the signal lines SL. The small areas ML2 are used for the exposure of the signal lines SL. The portion illustrated in FIG. 21 is the same as the portion illustrated in FIG. 20. For the purpose of comparison, FIG. 21 illustrates the small areas ML1 and the intersecting portions Q1, and the intersecting portions Q11 illustrated in FIG. 20. An intersecting portion Q2 between the outer edge of the small area ML2 and the signal line SL serving as the second metal layer corresponds to a portion affected by the exposure misalignment (positional misalignment portion of the metal layer).

As illustrated in FIG. 22, two small areas ML3 of the small areas ML (refer to FIG. 19) are illustrated so as to overlap the layout of the metal layer TM. The small areas ML3 are used for the exposure of the metal layer TM. The portion illustrated in FIG. 22 is the same as the portion illustrated in FIGS. 20 and 21. For the purpose of comparison, FIG. 22 illustrates the small areas ML1, the small areas ML2, the intersecting portions Q1, the intersecting portions Q11, and the intersecting portions Q2 illustrated in FIG. 21. Intersecting portions Q3 and Q33 between the metal layer TM and the outer edges of the small areas ML3 correspond to portions affected by the exposure misalignment (positional misalignment portions of the metal layer).

If the small area ML1, the small area ML2, and the small area ML3 are located at the same position, the intersecting portions Q1, Q2, and Q3 overlap one another in plan view, thus, generating an intersecting portion QQ illustrated in FIG. 23. In the intersecting portion QQ, the portions affected by the exposure misalignment (positional misalignment portions of the metal layer) overlap one another. Therefore, for example, light reflected at the portion of the first metal layer affected by the exposure misalignment (positional misalignment portion of the metal layer) is reflected again at the portion of the second metal layer affected by the exposure misalignment (positional misalignment portion of the metal layer) and at the portion of the metal layer TM affected by the exposure misalignment (positional misalignment portion of the metal layer). Thus, noise of the light is easily visible.

In contrast, if the small areas ML1, ML2, and ML3 are misaligned from one another as illustrated in FIGS. 20, 21, and 22, the intersecting portions Q1, Q2, and Q3 do not overlap one another in plan view. If the small areas ML1, ML2, and ML3 are misaligned from one another, the intersecting portions Q11 and Q33 do not overlap each other in plan view.

The width of the metal layer TM is greater than those of the signal line SL, the light-blocking layer GS, and the scan line GL. Therefore, the metal layer TM blocks the reflected light caused by the portions affected by the exposure misalignment (positional misalignment portions of the metal layers) at the intersecting portions Q1, Q11, and Q2. Thus, the noise of the light is hardly visible. Although the reflected light caused by the portions affected by the exposure misalignment (positional misalignment portions of the metal layers) at the intersecting portions Q3 and Q33 may be visible, such portions do not overlap the other portions affected by the exposure misalignment (the other positional misalignment portions of the metal layers). Therefore, the degree of noise recognition does not partially increase, and thus, does not affect the display quality. A portion of the reflected light caused by the portions affected by the exposure misalignment (positional misalignment portions of the metal layers) at the intersecting portions Q3 and Q33 is blocked by the light-blocking layer LS provided on the counter substrate 20, and thus, is hardly visible.

As described above, the display device 1 includes the array substrate 10, the counter substrate 20, the liquid crystal layer 50, and the light source 3. The array substrate 10 includes the pixel electrodes PE serving as first light-transmitting electrodes each disposed in a corresponding one of the pixels Pix. The array substrate 10 is provided with the signal lines SL arranged in the first direction PX with spaces interposed therebetween and the scan lines GL arranged in the second direction PY with spaces interposed therebetween. The counter substrate 20 includes the common electrode CE serving as a second light-transmitting electrode in a position overlapping the pixel electrodes PE in plan view. The liquid crystal layer 50 includes the polymer-dispersed liquid crystals LC filled between the array substrate 10 and the counter substrate 20. The light emitters 31 of the light source 3 emit the light in the second direction PY to a side surface of the counter substrate 20. The direction of incidence of the light that propagates in the array substrate 10 and the counter substrate 20 is the second direction. The light emitters 31 may emit the light that propagates in the array substrate 10 and the counter substrate 20 toward a side surface of the array substrate 10.

The positional misalignment portion of the signal line SL does not overlap the positional misalignment portion of the metal layer TM. As a result, the light reflected at the positional misalignment portion of the metal layer of the signal line SL is less likely to be intensified at the positional misalignment portion of the metal layer TM, and thus, the display device 1 is less likely to degrade in display quality.

The positional misalignment portion of the scan line GL does not overlap the positional misalignment portion of the metal layer TM. As a result, the light reflected at the positional misalignment portion of the metal layer of the scan line GL is less likely to be intensified at the positional misalignment portion of the metal layer TM, and thus, the display device 1 is less likely to degrade in display quality.

The display device 1 further includes the light-blocking layer GS that is provided in the same layer as that of each of the scan lines GL, extends along each of the signal lines SL, and is provided in a position overlapping part of the signal line SL. The positional misalignment portion of the light-blocking layer GS does not overlap the positional misalignment portion of the signal line SL. The light reflected at the positional misalignment portion of the metal layer of the light-blocking layer GS is less likely to be intensified at the positional misalignment portion of the signal line SL, and thus, the display device 1 is less likely to degrade in display quality.

Modification

Figure 24:
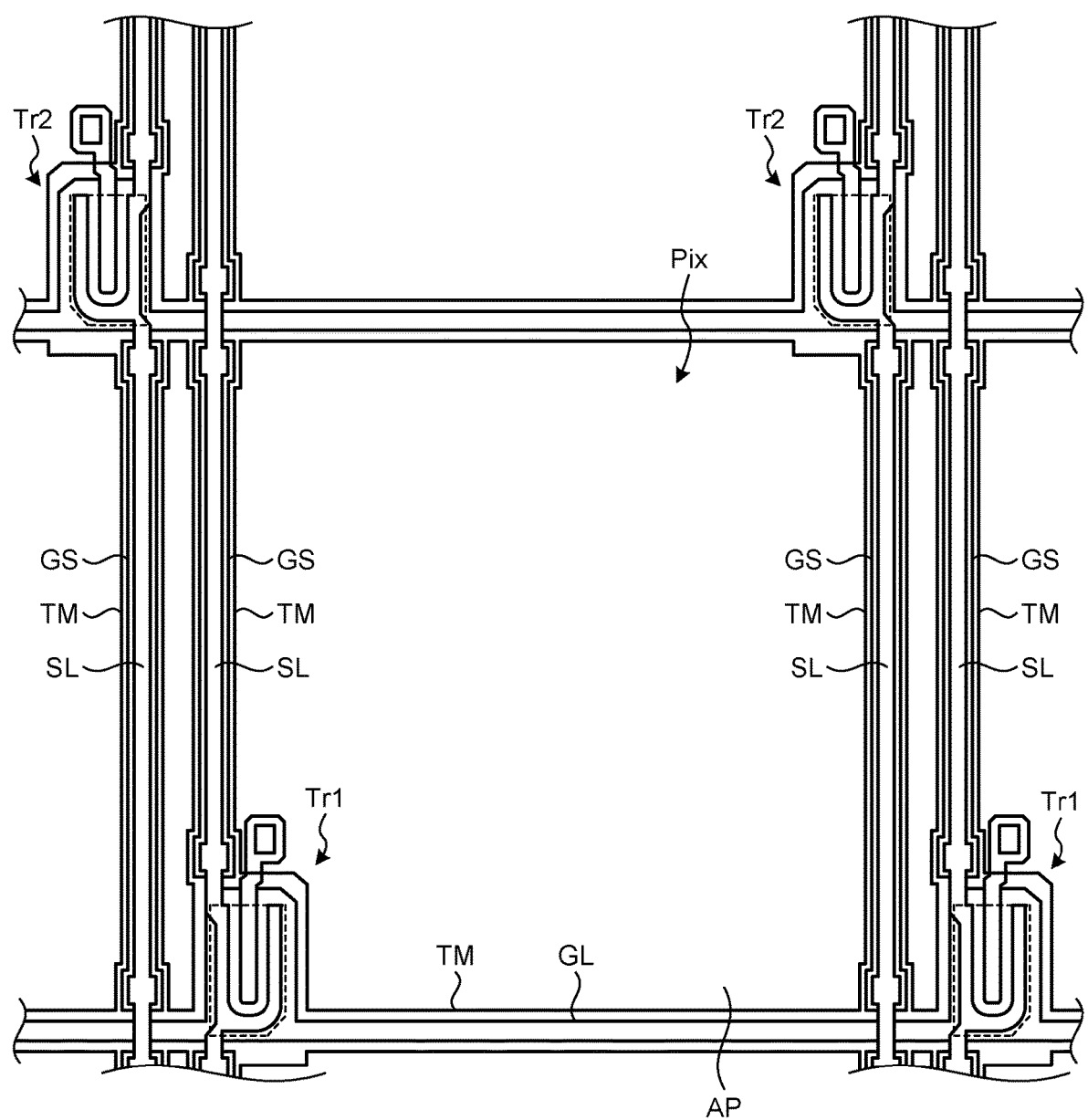
FIG. 24 is a plan view illustrating a planar surface of the display device of a modification.

FIG. 24 is a plan view illustrating the pixel of a modification. The same components as those described in the present embodiment described above are denoted by the same reference numerals, and the description thereof will not be repeated.

As illustrated in FIG. 24, the configuration of the pixels Pix of the modification differs from that of the pixels Pix of the present embodiment in that two signal lines SL are provided between adjacent pixels Pix. One of the signal lines SL is electrically coupled to switching elements Tr1 provided at intersecting portions of the signal line SL and the scan lines GL for every other pixel Pix. The other of the signal lines SL is electrically coupled to switching elements Tr2 provided at intersecting portions of the signal line SL and the scan lines GL for every other pixel Pix except the pixel Pix having the switching element Tr1.

This configuration allows the gate drive circuit 43 to simultaneously select adjacent two of the scan lines GL. As a result, the one vertical scan period GateScan illustrated in FIG. 3 is reduced. The reduction of the one vertical scan period GateScan relatively increases the first color light emission period RON, the second color light emission period GON, and the third color light emission period BON after the one vertical scan period GateScan.

In the modification, since the number of the signal lines SL increases, the number of the positional misalignment portions of the signal lines SL increases. Also in the modification, the positional misalignment portion of the signal line SL does not overlap the positional misalignment portion of the metal layer TM. As a result, the light reflected at the positional misalignment portion of the metal layer of the signal line SL is less likely to be intensified at the positional misalignment portion of the metal layer TM, and thus, the display device 1 is less likely to degrade in display quality.

Also in the modification, the positional misalignment portion of the light-blocking layer GS does not overlap the positional misalignment portion of the signal line SL. The light reflected at the positional misalignment portion of the metal layer of the light-blocking layer GS is less likely to be intensified at the positional misalignment portion of the signal line SL, and thus, the display device 1 is less likely to degrade in display quality. In the same manner, the positional misalignment portion of the scan line GL does not overlap the positional misalignment portion of the metal layer TM. As a result, the light reflected at the positional misalignment portion of the metal layer of the scan line GL is less likely to be intensified at the positional misalignment portion of the metal layer TM, and thus, the display device 1 is less likely to degrade in display quality.

The present embodiment has been described on the assumption that the switching element Tr has a bottom-gate structure. However, the switching element Tr is not limited to the bottom-gate structure as described above and may have a top-gate structure. If the switching element Tr has the top-gate structure, referring to the multilayered insulating film structure of FIG. 15, the structure will be such that the semiconductor layer SC is disposed between the first light-transmitting base member 19 and the first insulating layer 11, the gate electrode GE is disposed between the first insulating layer 11 and the second insulating layer 12, and the source electrode SE and the contact electrode DEA are formed between the second insulating layer 12 and the third insulating layer 13.

In addition, a direct-current voltage may be supplied as the common potential. That is, the common potential may be constant. Alternatively, an alternating-current voltage may be shared as the common potential. That is, the common potential may have two values of an upper limit value and a lower limit value. Whether the common potential is a direct-current potential or an alternating-current potential, the common potential is supplied to the holding capacitance electrode 10 and the common electrode CE.

As the third insulating layer 13 serving as a grid-shaped organic insulating film, the structure is disclosed in which the third insulating layer 13 inside the grid-shaped area is entirely removed, and the second insulating layer 12 and the holding capacitance electrode 10 in the lower layers are exposed. However, the present disclosure is not limited to this structure. For example, the structure may be obtained by using a halftone exposure technique to leave a thin part of the third insulating layer 13 inside the grid-shaped area surrounded by the signal lines SL and the scan lines GL. With this structure, the thickness of the third insulating layer 13 inside the grid-shaped area is made smaller than the thickness of the grid-shaped area surrounded by the signal lines SL and the scan lines GL.

While the preferred embodiment has been described above, the present disclosure is not limited to such an embodiment. The content disclosed in the embodiment is merely an example, and can be variously modified within the scope not departing from the gist of the present disclosure. Any modifications appropriately made within the scope not departing from the gist of the present disclosure also naturally belong to the technical scope of the present disclosure.

What is claimed is:

1. A display device comprising:
    an array substrate;
    a counter substrate;
    a liquid crystal layer between the array substrate and the counter substrate; and
    a light source disposed so as to emit light into a side surface of the array substrate or a side surface of the counter substrate,
    wherein the array substrate comprises:
        signal lines arranged in a first direction with spaces interposed between the signal lines;

scan lines arranged in a second direction with spaces interposed between the scan lines;
a switching element coupled to a corresponding one of the scan lines and a corresponding one of the signal lines;
an organic insulating layer that covers at least the switching element; and
a metal layer provided on the upper side of the organic insulating layer so as to overlap the organic insulating layer; and
a light-blocking layer that is provided in the same layer as that of each of the scan lines, extends along each of the signal lines, and is provided in a position overlapping part of the signal line,
wherein a positional misalignment portion of each of the signal lines does not overlap a positional misalignment portion of the metal layer,
wherein a positional misalignment portion of the light-blocking layer does not overlap the positional misalignment portion of each of the signal lines, and
wherein the positional misalignment portion of one of the signal lines, the positional misalignment portion of the light-blocking layer, and the positional misalignment portion of the metal layer are aligned with spaces along the one of the signal lines.

2. The display device according to claim 1, wherein the metal layer overlaps the signal lines and the scan lines in plan view and is disposed in a grid shape on the upper side of the organic insulating layer.

3. The display device according to claim 1, wherein, in plan view, a width of the metal layer that overlaps a signal line of the signal lines is greater than a width of the signal line, and a width of the metal layer that overlaps a scan line of the scan lines is greater than a width of the scan line.

4. A display device comprising:
an array substrate;
a counter substrate;
a liquid crystal layer between the array substrate and the counter substrate; and
a light source disposed so as to emit light into a side surface of the array substrate or a side surface of the counter substrate,
wherein the array substrate comprises:
signal lines arranged in a first direction with spaces interposed between the signal lines;
scan lines arranged in a second direction with spaces interposed between the scan lines;
a switching element coupled to a corresponding one of the scan lines and a corresponding one of the signal lines;
an organic insulating layer that covers at least the switching element; and
a metal layer provided on the upper side of the organic insulating layer so as to overlap the organic insulating layer,
wherein a positional misalignment portion of each of the scan lines does not overlap a positional misalignment portion of the metal layer, and
wherein the positional misalignment portion of one of the scan lines and the positional misalignment portion of the metal layer are aligned with spaces along the one of the scan lines.

5. The display device according to claim 4, wherein a positional misalignment portion of each of the signal lines does not overlap the positional misalignment portion of the metal layer, and
wherein the positional misalignment portion along one of the signal lines and the positional misalignment portion of the metal layer are aligned with spaces along the one of the signal lines.

6. The display device according to claim 5, further comprising a light-blocking layer that is provided in the same layer as that of each of the scan lines, extends along each of the signal lines, and is provided in a position overlapping part of the signal line, wherein a positional misalignment portion of the light-blocking layer does not overlap the positional misalignment portion of the signal line, and
wherein the positional misalignment portion of one of the signal lines, the positional misalignment portion of the light-blocking layer, and the positional misalignment portion of the metal layer are aligned with spaces along the one of the signal lines.

7. The display device according to claim 4, wherein the metal layer overlaps the signal lines and the scan lines in plan view and is disposed in a grid shape on the upper side of the organic insulating layer.

8. The display device according to claim 4, wherein, in plan view, a width of the metal layer that overlaps a signal line of the signal lines is greater than a width of the signal line, and a width of the metal layer that overlaps a scan line of the scan lines is greater than a width of the scan line.

9. A display device comprising:
an array substrate;
a counter substrate;
a liquid crystal layer between the array substrate and the counter substrate; and
a light source disposed so as to emit light into a side surface of the array substrate or a side surface of the counter substrate,
wherein the array substrate comprises:
signal lines arranged in a first direction with spaces interposed between the signal lines;
scan lines arranged in a second direction with spaces interposed between the scan lines;
a light-blocking layer that is provided in the same layer as that of each of the scan lines, extends along each of the signal lines, and is provided in a position overlapping part of the signal lines;
a switching element coupled to a corresponding one of the scan lines and a corresponding one of the signal lines;
an organic insulating layer that covers at least the switching element; and
a metal layer provided on the upper side of the organic insulating layer so as to overlap the organic insulating layer,
wherein a positional misalignment portion of the light-blocking layer does not overlap a positional misalignment portion of each of the signal lines, and
wherein the positional misalignment portion of one of the signal lines and the positional misalignment portion of the light-blocking layer are aligned with spaces along the one of the signal lines.

10. The display device according to claim 9, wherein the metal layer overlaps the signal lines and the scan lines in plan view and is disposed in a grid shape on the upper side of the organic insulating layer.

11. The display device according to claim 9, wherein, in plan view, a width of the metal layer that overlaps a signal line of the signal lines is greater than a width of the signal line, and a width of the metal layer that overlaps a scan line of the scan lines is greater than a width of the scan line.

12. The display device according to claim 1,
wherein the array substrate comprises first light-transmitting electrodes arranged one for each of the pixels,
wherein the counter substrate comprises a second light-transmitting electrode in a position overlapping the first light-transmitting electrodes, and
wherein the array substrate further comprises a third light-transmitting electrode that at least partially overlaps, in plan view, with the first light-transmitting electrodes in the pixel with an inorganic insulating layer interposed between the first light-transmitting electrode and the third light-transmitting electrode, and the metal layer is stacked on the third light-transmitting electrode.

13. The display device according to claim 1,
wherein the liquid crystal layer is formed of polymer-dispersed liquid crystals, and
wherein a background of the counter substrate is visible from the array substrate, and a background of the array substrate is visible from the counter substrate.

14. The display device according to claim 4,
wherein the array substrate comprises first light-transmitting electrodes arranged one for each of the pixels,
wherein the counter substrate comprises a second light-transmitting electrode in a position overlapping the first light-transmitting electrodes, and
wherein the array substrate further comprises a third light-transmitting electrode that at least partially overlaps, in plan view, with the first light-transmitting electrodes in the pixel with an inorganic insulating layer interposed between the first light-transmitting electrode and the third light-transmitting electrode, and the metal layer is stacked on the third light-transmitting electrode.

15. The display device according to claim 4,
wherein the liquid crystal layer is formed of polymer-dispersed liquid crystals, and
wherein a background of the counter substrate is visible from the array substrate, and a background of the array substrate is visible from the counter substrate.

16. The display device according to claim 9,
wherein the array substrate comprises first light-transmitting electrodes arranged one for each of the pixels,
wherein the counter substrate comprises a second light-transmitting electrode in a position overlapping the first light-transmitting electrodes, and
wherein the array substrate further comprises a third light-transmitting electrode that at least partially overlaps, in plan view, with the first light-transmitting electrodes in the pixel with an inorganic insulating layer interposed between the first light-transmitting electrode and the third light-transmitting electrode, and the metal layer is stacked on the third light-transmitting electrode.

17. The display device according to claim 9,
wherein the liquid crystal layer is formed of polymer-dispersed liquid crystals, and
wherein a background of the counter substrate is visible from the array substrate, and a background of the array substrate is visible from the counter substrate.

* * * * *